United States Patent
Kang et al.

(10) Patent No.: US 11,650,682 B2
(45) Date of Patent: May 16, 2023

(54) TOUCH DISPLAY DEVICE, DATA DRIVING CIRCUIT, AND TOUCH SENSING METHOD FOR SIMULTANEOUSLY PERFORMING TOUCH SENSING DURING DISPLAY DRIVING

(71) Applicant: LG DISPLAY CO., LTD., Seoul (KR)

(72) Inventors: HyeongWon Kang, Seoul (KR); Jaehun Jun, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 205 days.

(21) Appl. No.: 17/115,229

(22) Filed: Dec. 8, 2020

(65) Prior Publication Data

US 2021/0200354 A1 Jul. 1, 2021

(30) Foreign Application Priority Data

Dec. 26, 2019 (KR) .................. 10-2019-0174918

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *G09G 3/3275* (2013.01); *H01L 27/3272* (2013.01); *H01L 27/3276* (2013.01)

(58) Field of Classification Search
CPC ............. G06F 3/04184; G06F 3/04166; G06F 3/044; G06F 3/0446; G06F 3/0412; G06F 3/0416; H01L 27/3276; H01L 27/3272; G09G 3/3258; G09G 3/3275; G09G 2310/0297; G09G 2300/0842; G09G 2354/00; G09G 2310/0291; G09G 2300/0819
See application file for complete search history.

(56) References Cited

U.S. PATENT DOCUMENTS

| 2013/0342478 A1* | 12/2013 | Bae .................. G06F 3/0443 345/173 |
| 2014/0232955 A1* | 8/2014 | Roudbari ............... G06F 3/041 349/12 |
| 2019/0384437 A1 | 12/2019 | Kim et al. |

FOREIGN PATENT DOCUMENTS

| CN | 108228006 A | 6/2018 |
| TW | 201409453 A | 3/2014 |
| TW | I573067 B | 3/2017 |

\* cited by examiner

*Primary Examiner* — Yaron Cohen

(74) *Attorney, Agent, or Firm* — Birch, Stewart, Kolasch & Birch, LLP

(57) ABSTRACT

Embodiments of the present disclosure relate to a touch display device, a data driving circuit, and a touch sensing method. By sensing multiple data lines simultaneously using gate signals for display as touch driving pulses, it is possible to provide touch sensing without having a separate touch electrode for touch sensing and touch driving pulses. The touch sensing method includes outputting gate signals sequentially having a pulse section including two or more pulses to gate lines, by a gate driving circuit; outputting an image data voltage to data lines, by a source driving circuit; sensing the data lines by combining every N (N is a natural number of 2 or more) data lines or sensing a plurality of reference voltage lines by combining every N reference voltage lines, by a sensing circuit; and determining a touch or a touch coordinate, based on sensing values obtained by sensing of the sensing circuit.

23 Claims, 16 Drawing Sheets

(51) Int. Cl.
*G06F 3/044* (2006.01)
*G09G 3/3275* (2016.01)

TOUCH DISPLAY DEVICE, DATA DRIVING CIRCUIT, AND TOUCH SENSING METHOD FOR SIMULTANEOUSLY PERFORMING TOUCH SENSING DURING DISPLAY DRIVING

CROSS REFERENCE TO RELATED APPLICATION

This application claims priority from Korean Patent Application No. 10-2019-0174918, filed in the Republic of Korea on Dec. 26, 2019, the entire contents of which are hereby expressly incorporated by reference for all purposes as if fully set forth herein into the present application.

BACKGROUND OF THE INVENTION

1. Field of the Invention

Embodiments of the present disclosure relate to a touch display device, a data driving circuit, and a touch sensing method.

2. Description of the Related Art

In addition to the function of displaying a video or an image, a touch display device can provide a touch-based input function that allows a user to easily input information or commands intuitively and conveniently.

In order to provide a touch-based input function, such a touch display device should be able to detect a user's touch and accurately sense touch coordinates. To this end, the touch display device includes a touch panel having a touch sensor structure. The touch panel has a touch sensor structure including a plurality of touch electrodes and a plurality of touch routing wires for connecting the touch electrodes to a touch sensing circuit. Meanwhile, a plurality of touch pads (or a plurality of touch channels) to which a touch sensing circuit is electrically connected can exist in the touch panel.

Due to such a touch panel, the touch display device is complicated and the size is inevitably increased, and it becomes hard to manufacture. For this reason, there is a considerable difficulty in implementing a large touch display device. In addition, since the touch display device needs to separately perform a display driving for displaying an image and a touch driving for a touch sensing, the display driving time is insufficient or the touch driving time is insufficient.

SUMMARY OF THE INVENTION

Embodiments of the present disclosure can provide a touch display device, a data driving circuit, and a touch sensing method capable of sensing a touch without having a separate touch sensor structure for touch sensing.

In addition, embodiments of the present disclosure can provide a touch display device, a data driving circuit, and a touch sensing method capable of simultaneously performing display and touch sensing without having a separate touch sensor structure for touch sensing.

Embodiments of the present disclosure can provide a touch display device including a display panel in which a plurality of data lines and a plurality of gate lines are intersected with each other, and which includes a plurality of sub-pixels connected to the plurality of data lines and the plurality of gate lines; a gate driving circuit configured to sequentially output gate signals to the plurality of gate lines; and a data driving circuit configured to output image data voltages to the plurality of data lines.

In a touch display device according to embodiments of the present disclosure, the data driving circuit includes a source driving circuit configured to output the image data voltages to the plurality of data lines, and a sensing circuit configured to group and sense every N (N is a natural number of 2 or more) data lines of the plurality of data lines.

In a touch display device according to embodiments of the present disclosure, while the sensing circuit senses N data lines included in a first data line group among a plurality of data line groups having the plurality of data lines that are grouped for every N data lines, the gate driving circuit outputs M gate signals sequentially having a pulse section including two or more pulses to M (M is a natural number of 2 or more) gate lines among the plurality of gate lines.

In a touch display device according to embodiments of the present disclosure, the data driving circuit further can include a plurality of sensing timing control switches that control an electrical connection between the plurality of data lines and the source driving circuit, and the plurality of sensing timing control switches have at least one turn-off state during the pulse section of each of the gate signals.

In a touch display device according to embodiments of the present disclosure, the sensing circuit can include a plurality of analog front end circuits corresponding to the plurality of data line groups, and the plurality of analog front end circuits comprise a first analog front end circuit corresponding to the first data line group.

In a touch display device according to embodiments of the present disclosure, the first analog front end circuit can include a sum circuit and a sum charge amplifier, and the sum circuit can include N sampling capacitors.

In a touch display device according to embodiments of the present disclosure, one end of each of the N sampling capacitors is electrically connected to a respective one of the N data lines included in the first data line group, and all other ends of each of the N sampling capacitors are electrically connected to each other.

In a touch display device according to embodiments of the present disclosure, the sum charge amplifier can include: an operational amplifier including a sensing input terminal to which all other ends of each of the N sampling capacitors are electrically connected, a reference input terminal to which a reference voltage is applied, and a sensing output terminal that outputs a sum output signal; a feedback capacitor connected between the sensing output terminal and the sensing input terminal of the operational amplifier; and a sum reset switch connected between the sensing output terminal and the sensing input terminal of the operational amplifier.

In a touch display device according to embodiments of the present disclosure, the plurality of sensing timing control switches and the N data lines included in the first data line group can be electrically connected in first points, and one end of each of the N sampling capacitors can be connected, between a respective one of the N data lines included in the first data line group and a respective one of the first points.

In a touch display device according to embodiments of the present disclosure, during one frame time, the pulse section of each of the gate signals can include two or more turn-on level gate voltage sections and one or more turn-off level gate voltage sections.

In a touch display device according to embodiments of the present disclosure, the data driving circuit further can include a plurality of sensing timing control switches that control an electrical connection between the plurality of data lines and the source driving circuit, the sensing timing control switches are in a turn-on state, during a turn-off level gate voltage section that is not the pulse section in the gate signal, and the sensing timing control switches are in a turn-off state, during a turn-off level gate voltage section in the pulse section in the gate signals.

In a touch display device according to embodiments of the present disclosure, the first analog front end circuit further can include a dual sampling integrating circuit which is electrically connected to the sensing output terminal of the sum charge amplifier, receives a positive sum output signal and a negative sum output signal of the sum charge amplifier, inverts the negative sum output signal to sum with the positive sum output signal, and integrates the summed signal and outputs the integrated signal.

In a touch display device according to embodiments of the present disclosure, the dual sampling integrating circuit can include a dual sampling switch circuit and an integrator, and the dual sampling switch circuit can include a positive sampling switch circuit and a negative sampling switch circuit, and the positive sampling switch circuit and the negative sampling switch circuit are connected in parallel between the sensing output terminal of the sum charge amplifier and an input terminal of the integrator.

In a touch display device according to embodiments of the present disclosure, the positive sampling switch circuit can include a positive sampling capacitor; a first positive switch connected between one end of the positive sampling capacitor and the sensing output terminal of the sum charge amplifier; a second positive switch connected between the other end of the positive sampling capacitor and the input terminal of the integrator; a third positive switch connected between the other terminal of the positive sampling capacitor and an integral reference voltage node; and a fourth positive switch connected between one end of the positive sampling capacitor and the integral reference voltage node. The negative sampling switch circuit can include a negative sampling capacitor; a first negative switch connected between one end of the negative sampling capacitor and the integral reference voltage node; a second negative switch connected between one end of the negative sampling capacitor and the sensing output terminal of the sum charge amplifier; a third negative switch connected between the other end of the negative sampling capacitor and the integral reference voltage node; and a fourth negative switch connected between the other end of the negative sampling capacitor and the input terminal of the integrator.

In a touch display device according to embodiments of the present disclosure, when the gate signal falls from a high level voltage to a low level voltage among the turn-on level gate voltage and the turn-off level gate voltage, the first positive switch and the third positive switch can be in a turn-on state, and the first negative switch and the third negative switch can be in a turn-off state, after the gate signal falls from a high level voltage to a low level voltage among the turn-on level gate voltage and the turn-off level gate voltage, the second positive switch and the fourth positive switch can be turned on, and when the gate signal rises from a low level voltage to a high level voltage among the turn-on level gate voltage and the turn-off level gate voltage, the second negative switch and the fourth negative switch can be in a turn-on state.

In a touch display device according to embodiments of the present disclosure, during the turn-off level gate voltage section in the pulse section of the gate signal, the sum reset switch can be changed from a turn-off state to a turn-on state, and then changed again to a turn-off state.

In a touch display device according to embodiments of the present disclosure, during a first period within one frame time, the gate driving circuit can sequentially output gate signals sequentially having the pulse section to the M gate lines intersecting the N data lines included in the first data line group, the data driving circuit can output the image data voltages to the N data lines included in the first data line group, during the first period, the sum charge amplifier in the first analog front end circuit can output the sum output signal corresponding to capacitances between the N data lines included in the first data line group and the M gate lines.

In a touch display device according to embodiments of the present disclosure, an area occupied by M*N sub-pixels in which the N data lines and the M gate lines are connected can be one touch node for touch sensing. Each of the plurality of sub-pixels can include: a light emitting device; a driving transistor configured to drive the light emitting device; a scan transistor which is controlled to be turned on/off by a scan signal that is one type of the gate signal supplied from a scan line that is one type of the gate line, and controls an electrical connection between a first node of the driving transistor and the data line; and a storage capacitor configured to be electrically connected between the first node and a second node of the driving transistor, wherein the data line electrically connected to the first node of the driving transistor through the scan transistor is electrically connected to the sensing circuit.

In a touch display device according to embodiments of the present disclosure, the display panel further can include a first light shield pattern electrically connected to the data line.

In a touch display device according to embodiments of the present disclosure, the scan signal can have a pulse section including two or more pulses within one frame time, the display panel further can include a second light shield pattern electrically connected to the scan line, and the second light shield pattern and the first light shield pattern are separated from each other.

In a touch display device according to embodiments of the present disclosure, each of the plurality of sub-pixels further can include a sense transistor which is controlled to be turned on/off by a sense signal that is another type of the gate signal supplied from a sense line that is another type of the gate line, and controls an electrical connection between a second node of the driving transistor and a reference voltage line, and at least one of the scan signal and the sense signal has a pulse section including two or more pulses within one frame time.

In a touch display device according to embodiments of the present disclosure, the display panel further can include a second light shield pattern electrically connected to at least one of the scan line and the sense line. The second light shield pattern can be disposed between display column lines intersecting the scan line and the sense line.

In a touch display device according to embodiments of the present disclosure, the reference voltage line can be electrically connected to the sensing circuit.

In a touch display device according to embodiments of the present disclosure, the display panel further can include a first light shield pattern electrically connected to at least one of the data line and the reference voltage line. The first light shield pattern can be disposed to overlap a channel of the driving transistor of each of the plurality of sub-pixels.

Embodiments of the present disclosure can provide a data driving circuit comprising: a source driving circuit configured to output image data voltages to a plurality of data lines; a sensing circuit configured to group and sense every N (N is a natural number of 2 or more) data lines of the plurality of data lines; and a plurality of sensing timing control switches configured to disconnect a connection between the source driving circuit and the plurality of data lines for a preset period and then to reconnect the source driving circuit and the plurality of data lines, while the source driving circuit outputs the image data voltages to the plurality of data lines, wherein during a period in which the connection between the source driving circuit and the plurality of data lines is disconnected by the plurality of sensing timing control switches, the sensing circuit senses N data lines included in a first data line group among a plurality of data line groups in which the plurality of data lines are grouped for every N data lines.

Embodiments of the present disclosure can provide a touch sensing method comprising: outputting gate signals sequentially having a pulse section including two or more pulses to a plurality of gate lines, by a gate driving circuit; outputting an image data voltage to a plurality of data lines, by a source driving circuit; sensing the plurality of data lines by combining every N (N is a natural number of 2 or more) data lines or sensing a plurality of reference voltage lines by combining every N reference voltage lines, by a sensing circuit; and determining a touch or a touch coordinate, based on sensing values obtained by sensing of the sensing circuit.

The touch sensing method of embodiments of the present disclosure can further comprise disconnecting a connection between the source driving circuit and the plurality of data lines for a preset period, and after the preset period, reconnecting the source driving circuit and the plurality of data lines.

Embodiments of the present disclosure can provide a touch display device comprising: a display panel in which a plurality of display column lines and a plurality of display row lines are intersected with each other; a display row driving circuit configured to sequentially output display row driving signals to the plurality of display row lines; a display column driving circuit configured to output display column driving signals to the plurality of display column lines; and a sensing circuit configured to group and sense the plurality of display column lines for every N (N is a natural number of 2 or more) display column lines.

In a touch display device according to embodiments of the present disclosure, while the sensing circuit senses N display column lines included in a first display column line group among a plurality of display column line groups in which the plurality of display column lines are grouped for every N display column lines, the display row driving circuit outputs M display row signals sequentially having a pulse section including two or more pulses to M (M is a natural number of 2 or more) display row lines among the plurality of display row lines.

In a touch display device according to embodiments of the present disclosure, each of the plurality of sub-pixels can include: a light emitting device; a driving transistor configured to drive the light emitting device; a scan transistor which is controlled to be turned on/off by a scan signal supplied from a scan line, and controls an electrical connection between a first node of the driving transistor and a data line; a sense transistor which is controlled to be turned on/off by a sense signal supplied from a sense line, and controls an electrical connection between a second node of the driving transistor and a reference voltage line; and a storage capacitor configured to be electrically connected between the first node and the second node of the driving transistor.

In a touch display device according to embodiments of the present disclosure, the plurality of display row lines can include at least one of the scan line and the sense line, and the plurality of display column lines can include at least one of the data line and the reference voltage line.

In a data driving circuit according to embodiments of the present disclosure, during a period in which a connection between a source driving circuit and a plurality of data lines is disconnected by a plurality of sensing timing control switches, the sensing circuit can sense N data lines included in a first data line group among a plurality of data line groups in which a plurality of data lines are grouped for every N data lines.

According to embodiments of the present disclosure, a touch can be sensed without having a separate touch sensor structure for touch sensing. Hence, the size of the touch display device can be significantly reduced, and the number of components and manufacturing process can be simplified.

In addition, according to embodiments of the present disclosure, a display and a touch sensing can be simultaneously performed without a separate touch sensor structure for touch sensing. Accordingly, it is possible to ensure the display driving time and the touch sensing time as much as possible, thereby improving the display performance and the touch sensing performance.

In addition, according to embodiments of the present invention, implementation of a large touch display device can be facilitated.

BRIEF DESCRIPTION OF THE DRAWINGS

The above and other objects, features and advantages of the present disclosure will be more apparent from the following detailed description in conjunction with the accompanying drawings, in which.

DETAILED DESCRIPTION OF THE PREFERRED EMBODIMENTS

Figure 1:
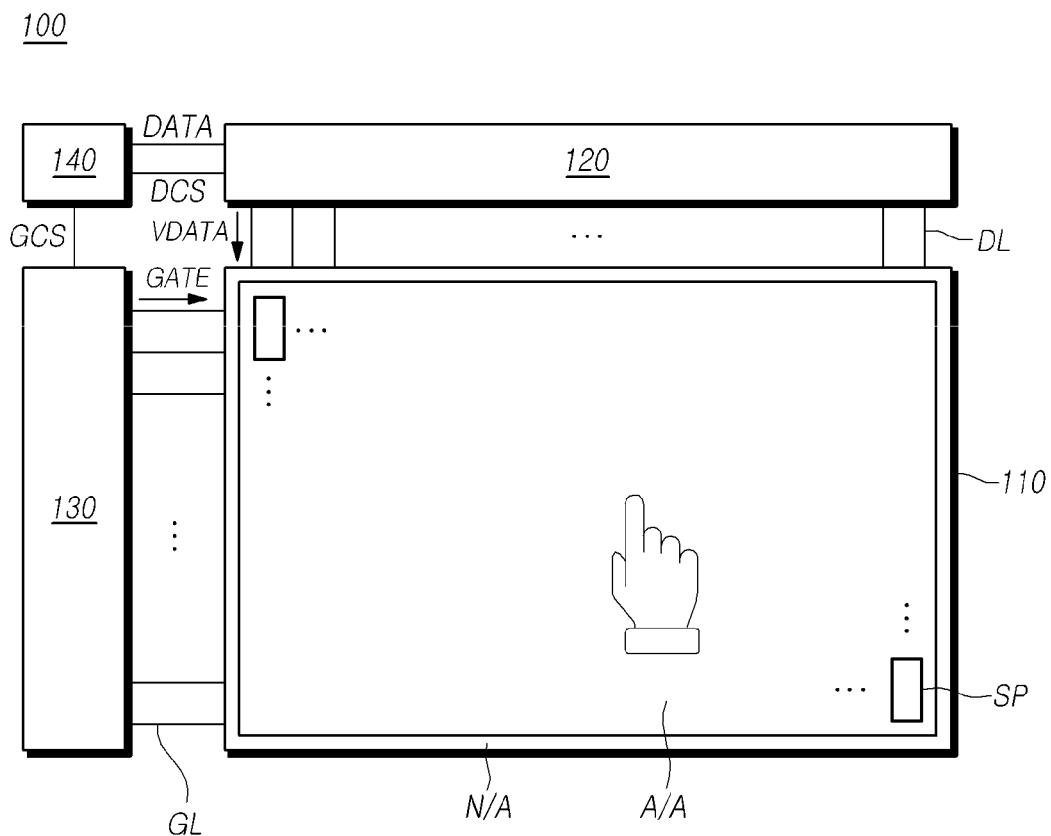
FIG. 1 is a system configuration diagram of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting", and "comprising" used herein are generally intended to allow other components to be added unless the terms are used with the term "only". As used herein, singular forms are intended to include plural forms unless the context clearly indicates otherwise.

Terms, such as "first", "second", "A", "B", "(a)", or "(b)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "overlaps" etc. a second element, it should be interpreted that, not only can the first element "be directly connected or coupled to" or "directly overlap" the second element, but a third element can also be "interposed" between the first and second elements, or the first and second elements can "be connected or coupled to", "overlap", etc. each other via a fourth element. Here, the second element can be included in at least one of two or more elements that "are connected or coupled to", "overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a system configuration diagram of a touch display device 100 according to embodiments of the present disclosure. All components of the touch display device according to all embodiments of the present disclosure are operatively coupled and configured.

Referring to FIG. 1, a touch display device 100 according to embodiments of the present disclosure can provide a display function for displaying an image and a touch sensing function for sensing a touch by a touch object such as user's finger or a pen.

The touch display device 100 according to embodiments of the present disclosure is components for providing a display function, and includes a display panel 110 including a plurality of data lines DL and a plurality of gate lines GL intersecting with each other, and including a plurality of sub-pixels SP connected to the plurality of data lines DL and the plurality of gate lines GL, a gate driving circuit 130 sequentially outputting gate signals GATE to the plurality of gate lines GL, and a data driving circuit 120 for outputting image data voltages VDATA to the plurality of data lines DL The display panel 110 can include an active area A/A in which an image is displayed and a non-active area N/A in which an image is not displayed.

In the active area A/A of the display panel 110, a plurality of sub-pixels SP for image display are arranged. The display panel 110 can include signal wires such as a plurality of data lines DL and a plurality of gate lines GL to drive a plurality of sub-pixels SP.

In the display panel 110, a plurality of data lines DL and a plurality of gate lines GL can be disposed to intersect with each other. For example, a plurality of data lines DL can be disposed in a row or a column, and a plurality of gate lines GL can be disposed in a column or a row.

In the following, for convenience of description, it is assumed that a plurality of data lines DL are disposed in a column, and a plurality of gate lines GL are disposed in a row. In this case, signal wires for display disposed in the column direction, such as a data line DL, a reference voltage line (RVL in FIG. 3), and a driving voltage line DVL, are also referred to as display column lines. In addition, signal wires for display disposed in the row direction, e.g., gate lines GL such as scan line (SCL in FIGS. 2 and 3 FIG. 3) and sense line (SENL in FIG. 3), are also referred to as display row lines.

A controller 140 supplies various control signals DCS, GCS required for the driving operation of the data driving circuit 120 and the gate driving circuit 130, so that the data driving circuit 120 and the gate driving circuit 130 can be controlled.

The controller 140 starts scanning according to the timing implemented in each frame, converts input image data input from the outside according to a data signal format used by the data driving circuit 120, and then outputs the converted image data DATA and controls data driving at a suitable time according to the scan.

The controller 140, together with the input image data, receives various timing signals including a vertical synchronization signal Vsync, a horizontal synchronization signal Hsync, an input data enable DE signal, a clock signal CLK, and the like from an external (e.g., host system).

In addition to converting the input image data input from the outside according to a data signal format used by the data driving circuit 120, and outputting the converted image data DATA, in order to control the data driving circuit 120 and the gate driving circuit 130, the controller 140 receives a timing signal such as a vertical synchronization signal Vsync, a horizontal synchronization signal Hsync, an input DE signal, a clock signal, and the like, and generates various control signals to output to the data driving circuit 120 and the gate driving circuit 130.

For example, in order to control the gate driving circuit 130, the controller 140 outputs various gate control signals GCS including a gate start pulse GSP, a gate shift clock GSC, a gate output enable GOE signal, and the like. Here, the gate start pulse GSP controls the operation start timing of one or more gate driver integrated circuits constituting the gate driving circuit 130. The gate shift clock GSC is a clock signal commonly input to one or more gate driver integrated circuits, and controls the shift timing of a scan signal (gate pulse). The gate output enable GOE signal specifies timing information of one or more gate driver integrated circuits.

In addition, in order to control the data driving circuit 120, the controller 140 outputs various data control signals DCS including a source start pulse SSP, a source sampling clock SSC, a source output enable SOE signal, and the like. Here, the source start pulse SSP controls the start timing of data sampling of one or more source-driver integrated circuit constituting the data driving circuit 120. The source sampling clock SSC is a clock signal that controls the sampling timing of data in the source-driver integrated circuit. The source output enable SOE signal controls the output timing of the data driving circuit 120.

The controller 140 can be a timing controller used in a conventional display technology, or a control device that has a timing controller and can further perform other control function.

The controller 140 can be implemented of a separate component from the data driving circuit 120, or can be integrated with the data driving circuit 120 to be implemented as an integrated circuit.

The data driving circuit 120 receives the image data DATA from the controller 140 and supplies an image data voltage VDATA to a plurality of data lines DL, thereby driving the plurality of data lines DL.

The data driving circuit 120 can include at least one source-driver integrated circuit S-DIC. Each source-driver integrated circuit S-DIC can include a shift register, a latch circuit, a digital to analog converter DAC, an output buffer, and the like. Each source-driver integrated circuit S-DIC can further include an analog-to-digital converter ADC, in some cases.

Each source-driver integrated circuit S-DIC can be directly connected to the bonding pad of the display panel 110 in a Tape Automated Bonding TAB scheme, a Chip On Glass COG scheme, or in a Chip On Panel COP scheme, or can be directly disposed in the display panel 110, and in some cases, can be integrated and disposed in the display panel 110. In addition, each source-driver integrated circuit S-DIC can be implemented in a chip-on-film COF scheme of mounting on a source-circuit film connected to the display panel 110.

The gate driving circuit 130 sequentially drives the plurality of gate lines GL by sequentially supplying a scan signal to the plurality of gate lines GL. Here, the gate driving circuit 130 is also referred to as a scan driving circuit.

The gate driving circuit 130 can include a shift register, a level shifter, and the like.

The gate driving circuit 130 can be connected to the bonding pad of the display panel 110 in a Tape Automated Bonding TAB scheme, a Chip On Glass COG scheme, or in a Chip On Panel COP scheme, or can be implemented in a Gate In Panel GIP type and directly disposed in the display panel 110, and in some cases, can be integrated and disposed in the display panel 110. In addition, the gate driving circuit 130 can be implemented as a chip-on-film COF scheme implemented as a plurality of gate driver integrated circuits G-DIC and mounted on a gate-circuit film connected to the display panel 110.

The gate driving circuit 130 sequentially supplies a scan signal of turn-on voltage or turn-off voltage to a plurality of gate lines GL under the control of the controller 140.

When a specific gate line is opened by the gate driving circuit 130, the data driving circuit 120 converts the image data DATA received from the controller 140 into an analog image data voltage VDATA and supplies to the plurality of data lines DL.

The data driving circuit 120 can be positioned in only one side (e.g., the upper side or the lower side) of the display panel 110, and in some cases, can be positioned in both sides (e.g., the upper side and the lower side) of the display panel 110 according to a driving method, a panel design method, or the like.

The gate driving circuit 130 can be positioned in only one side (e.g., the left side or the right side) of the display panel 110, and in some cases, can be positioned in both sides (e.g., the left and right sides) of the display panel 110 according to a driving method, a panel design method, or the like.

The plurality of gate lines GL disposed in the display panel 110 can include a plurality of scan lines, and can include a plurality of sense lines and/or a plurality of light emission control lines according to a sub-pixel structure. Here, the scan line, the sense line, and the light emission control line are connected with a gate node of different types of transistors (scan transistor, sense transistor, light emission control transistor), and are wires that transmit different types of gate signal (GATE) (scan signal, sense signal, light emission control signal). Hereinafter, it will be described with reference to FIGS. 2 and 3.

The touch display device 100 according to the present embodiments can be a self-emission display such as an organic light emitting diode (OLED) display, a quantum dot display, or a micro light emitting diode (LED) display.

When the touch display device 100 according to the present embodiments is an OLED display, each sub-pixel SP can include an organic light emitting diode (OLED) that emits light itself as a light emitting device. When the touch display device 100 according to the present embodiments is a quantum dot display, each sub-pixel SP can include a light emitting device made of quantum dot which is a semiconductor crystal that emits light itself. When the touch display device 100 according to the present embodiments is a micro LED display, each sub-pixel SP can include a micro light emitting diode (LED) that emits light itself and is made of an inorganic material as a light emitting device.

The touch display device 100 according to the present embodiments can be a display, such as a liquid crystal display (LCD), that further includes a light emitting device (e.g., a backlight unit, etc.) separately from the display panel 110.

In order to provide a touch sensing function, the touch display device 100 according to embodiments of the present disclosure does not separately include a touch panel in which separate touch electrodes and touch wirings for touch sensing are disposed. In addition, the display panel 110 of the touch display device 100 according to embodiments of the present disclosure does not include separate touch electrodes or touch wirings for touch sensing. In addition, the touch display device 100 according to embodiments of the present disclosure does not use a separate touch driving signal for touch sensing.

Although the touch display device 100 according to embodiments of the present disclosure does not separately include dedicated components (e.g., touch electrode, touch wiring, etc.) for touch sensing, and does not provide a driving method using a separate touch driving signal, it can provide a touch sensing function by utilizing the components (e.g., data lines, gate lines, etc.) for display function and the signals (e.g., gate signals (GATE)) for driving the components.

Figure 2:
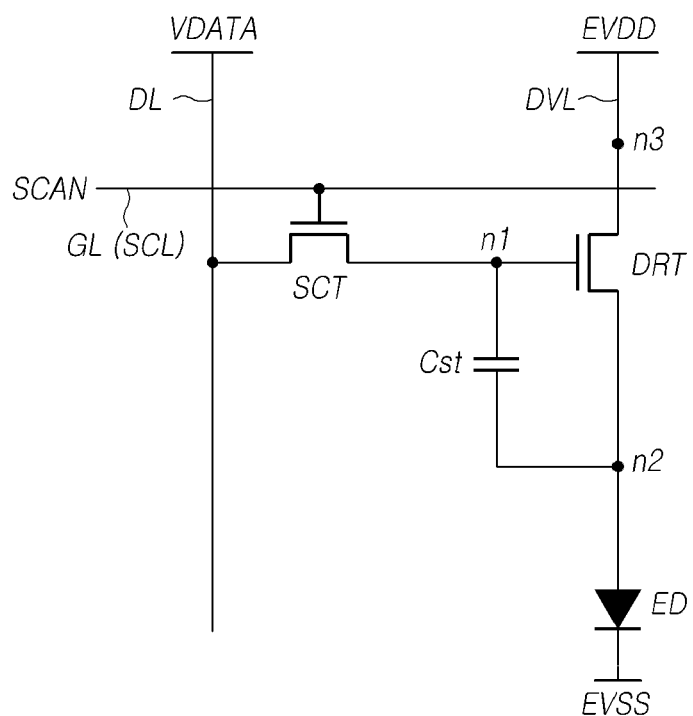
FIG. 2 is an equivalent circuit of a sub-pixel of a touch display device according to embodiments of the present disclosure.
Figure 3:
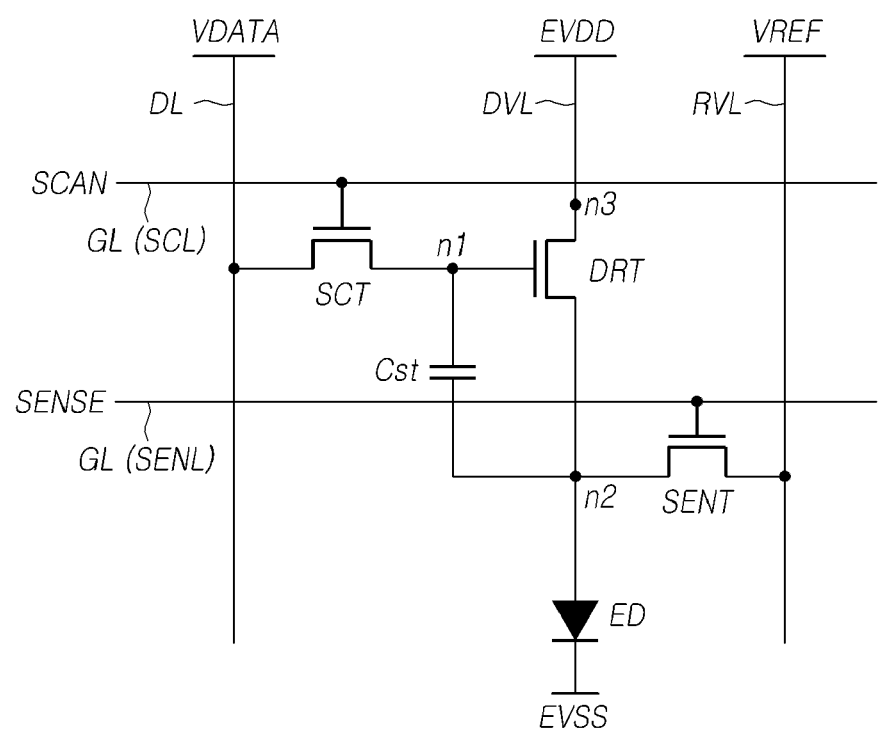
FIG. 3 is another equivalent circuit of a sub-pixel of a touch display device according to embodiments of the present disclosure.

FIG. 2 is an equivalent circuit of a sub-pixel of a touch display device according to embodiments of the present disclosure, and FIG. 3 is another equivalent circuit of a sub-pixel of a touch display device according to embodiments of the present disclosure.

Referring to FIG. 2, each of the plurality of sub-pixels SP can include a light emitting device ED, a driving transistor DRT for driving the light emitting device ED, a scan transistor SCT which is controlled to be turned on/off by the scan signal SCAN which is a type of the gate signal GATE supplied from the scan line SCL which is a type of the gate line GL, and controls electrical connection between a first node n1 of the driving transistor DRT and the data line DL, and a storage capacitor Cst electrically connected between the first node n1 and a second node n2 of the driving transistor DRT.

A sub-pixel structure of FIG. 2 is a basic 2T (Transistor) 1C (Capacitor) structure. In some cases, each sub-pixel SP can further include one or more transistors and/or one or more capacitors. For example, as shown in FIG. 3, each sub-pixel SP can have a 3T1C structure further including a sense transistor SENT.

Referring to FIG. 3, the sense transistor SENT is controlled to be turned on/off by the sense signal SENSE which is another type of the gate signal GATE supplied from a sense line SENL which is another type of the gate line GL, and can control electrical connection between the second node n2 of the driving transistor DRT and a reference voltage line RVL.

The components in each sub-pixel SP will be described below.

The light emitting device ED includes a first electrode and a second electrode, and a light emitting layer positioned between the first electrode and the second electrode. The first electrode of the light emitting device ED can be an anode electrode or a cathode electrode, and the second electrode can be a cathode electrode or an anode electrode. The light emitting device ED can be, for example, an organic light emitting diode (OLED), a light emitting diode (LED), a quantum dot light emitting device, or the like.

The second electrode of the light emitting device ED can be a common electrode. In this case, a base voltage EVSS can be applied to the second electrode of the light emitting device ED. Here, the base voltage EVSS can be, for example, a ground voltage or a voltage similar to the ground voltage.

The driving transistor DRT is a transistor for driving the light emitting device ED, and includes a first node n1, a second node n2, and a third node n3.

The first node n1 of the driving transistor DRT is a node corresponding to a gate node, and can be electrically connected to a source node or a drain node of the scan transistor SCT. The second node n2 of the driving transistor DRT can be electrically connected to the first electrode of the light emitting device ED, and can be a source node or a drain node. The third node n3 of the driving transistor DRT is a node to which the driving voltage EVDD is applied, and can be electrically connected to the driving voltage line DVL that supplies the driving voltage EVDD, and can be a drain node or a source node.

In response to a scan signal SCAN supplied from a corresponding scan line SCL among a plurality of scan lines SCL which are a type of the gate line GL, the scan transistor SCT can control the connection between the first node n1 of the driving transistor DRT and a corresponding data line DL among the plurality of data lines DL.

The drain node or the source node of the scan transistor SCT can be electrically connected to a corresponding data line DL. The source node or the drain node of the scan transistor SCT can be electrically connected to the first node n1 of the driving transistor DRT. The gate node of the scan transistor SCT can be electrically connected to the scan line SCL, which is a type of the gate line GL, to receive the scan signal SCAN.

The scan transistor SCT is turned on by the scan signal SCAN of the turn-on level gate voltage, so that the image data voltage VDATA supplied from a corresponding data line DL can be transmitted to the first node n1.

The scan transistor SCT is turned on by the scan signal SCAN of the turn-on level gate voltage, and turned off by the scan signal SCAN of the turn-off level gate voltage. Here, when the scan transistor SCT is n-type, the turn-on level gate voltage can be a high level voltage, and the turn-off level gate voltage can be a low level voltage. When the scan transistor SCT is p-type, the turn-on level gate voltage can be a low level voltage and the turn-off level gate voltage can be a high level voltage.

In response to a sense signal SENSE supplied from a corresponding sense line SENL among a plurality of sense lines SENL which are a type of gate line GL, the sense transistor SENT can control a connection between the second node n2 of the driving transistor DRT electrically connected to the first electrode of the light emitting device ED and a corresponding reference voltage line RVL among the plurality of reference voltage lines RVL.

The drain node or the source node of the sense transistor SENT can be electrically connected to the reference voltage line RVL. The source node or the drain node of the sense transistor SENT can be electrically connected to the second node n2 of the driving transistor DRT, and can be electrically connected to the first electrode of the light emitting device ED. The gate node of the sense transistor SENT can be electrically connected to the sense line SENL, which is a type of the gate line GL, to receive the sense signal SENSE.

The sense transistor SENT is turned on to apply the reference voltage VREF supplied from the reference voltage line RVL to the second node n2 of the driving transistor DRT.

The sense transistor SENT is turned on by the sense signal SENSE of the turn-on level gate voltage, and turned off by the sense signal SENSE of the turn-off level gate voltage. Here, when the sense transistor SENT is n-type, the turn-on level gate voltage can be a high level voltage, and the turn-off level gate voltage can be a low level voltage. When the sense transistor SENT is a p-type, the turn-on level gate voltage can be a low level voltage and the turn-off level gate voltage can be a high level voltage.

In the following drawings, the scan transistor SCT and the sense transistor SENT are n-type, and turn-on level gate voltage of each of the scan signal SCAN and the sense signal SENSE is a high level voltage and the turn-off level gate voltage of each of the scan signal SCAN and the sense signal SENSE is shown to be a low level voltage.

The storage capacitor Cst is electrically connected between the first node n1 and the second node n2 of the driving transistor DRT so that the image data voltage VDATA corresponding to the image signal voltage or a voltage corresponding thereto can be maintained for one frame time.

The storage capacitor Cst is not a parasitic capacitor (e.g., Cgs, Cgd) which is an internal capacitor existing between the first node n1 and the second node n2 of the driving transistor DRT, but can be an external capacitor intentionally designed outside the driving transistor DRT.

Each of the driving transistor DRT, the scan transistor SCT, and the sense transistor SENT can be an n-type transistor or a p-type transistor. All of the driving transistor DRT, the scan transistor SCT, and the sense transistor SENT can be n-type transistors or p-type transistor. At least one of the driving transistor DRT, the scan transistor SCT, and the sense transistor SENT can be an n-type transistor (or p-type transistor) and the other can be a p-type transistor (or n-type transistor).

Each sub-pixel structure shown in FIGS. 2 and 3 is just an example for description, and can further include one or more transistors, or in some cases, can further include one or more capacitors. Alternatively, each of the plurality of sub-pixels can have the same structure, and some of the plurality of sub-pixels can have a different structure.

In the following, the touch display device 100, the data driving circuit 120, and the touch sensing method that can provide a touch sensing function while not separately including dedicated components (e.g., touch electrode, touch wiring, etc.) for touch sensing, and not separately performing a driving method using a separate touch driving signal will be described in detail.

Figure 4:
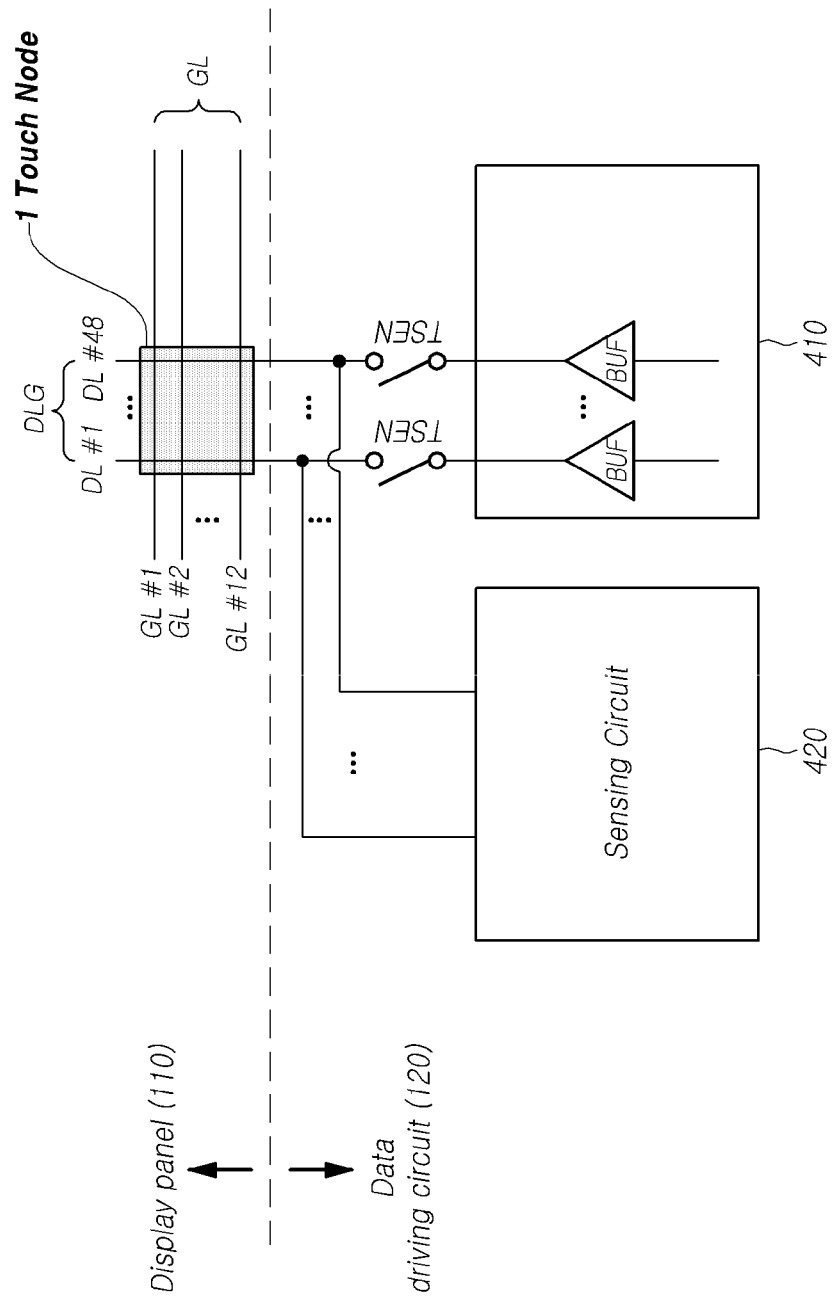
FIG. 4 is a diagram illustrating a touch sensing structure of a touch display device according to embodiments of the present disclosure.
Figure 5:
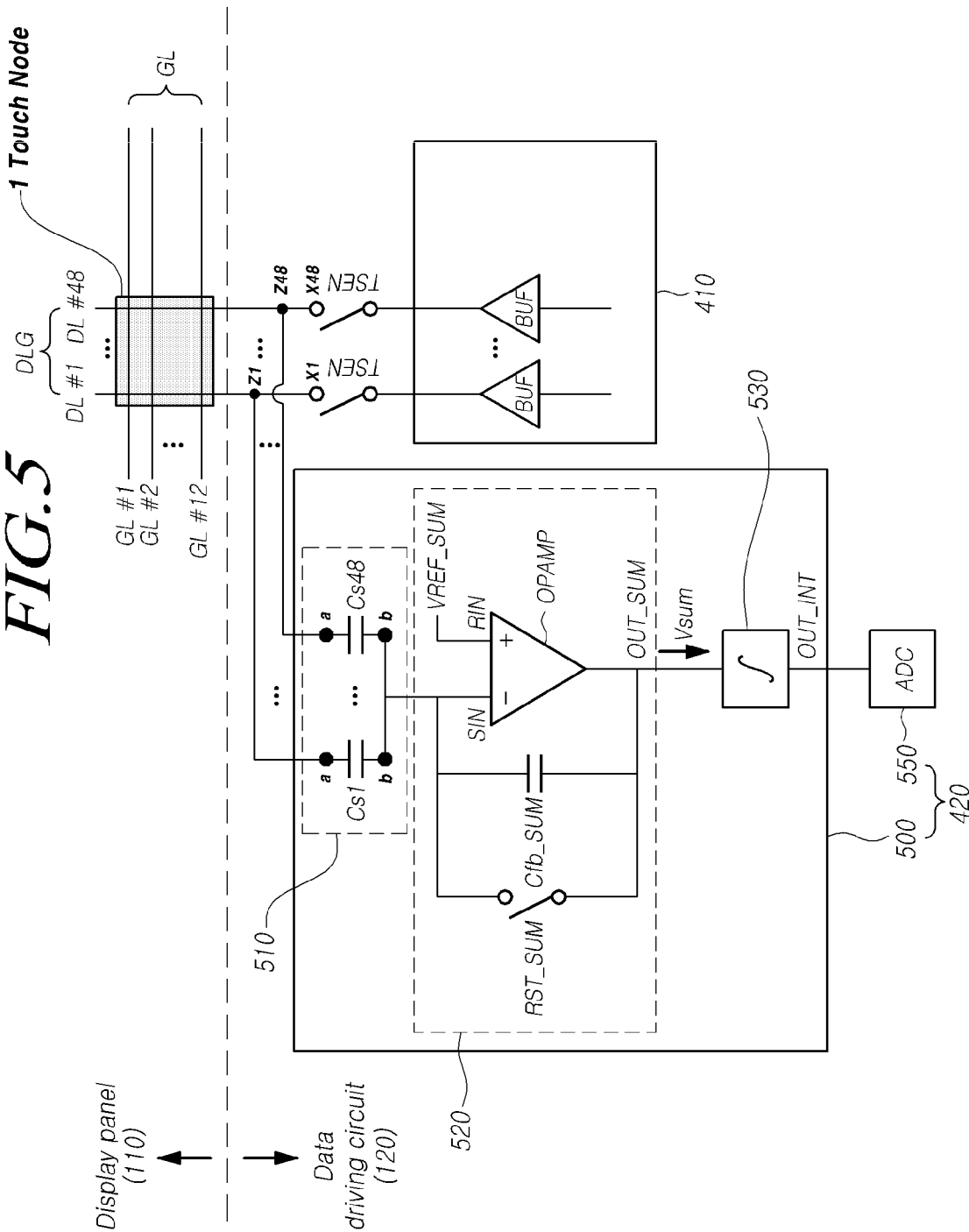
FIG. 5 is a diagram illustrating a sensing circuit of a touch display device according to embodiments of the present disclosure.
Figure 6:
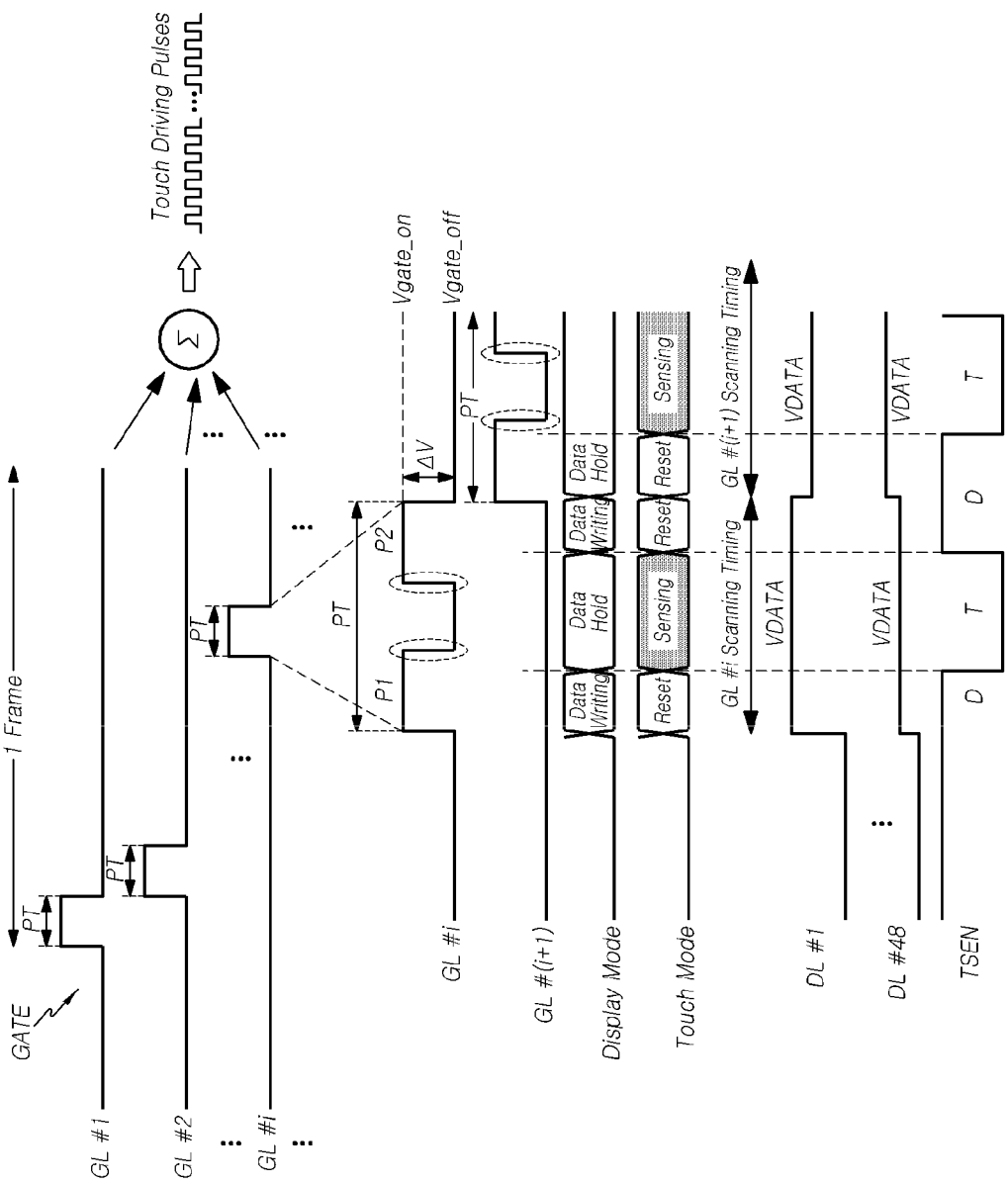
FIG. 6 is an operation timing diagram of a touch display device according to embodiments of the present disclosure.

FIG. 4 is a diagram illustrating a touch sensing structure of a touch display device 100 according to embodiments of the present disclosure, FIG. 5 is a diagram illustrating a sensing circuit 420 of a touch display device 100 according to embodiments of the present disclosure, and FIG. 6 is an operation timing diagram of a touch display device 100 according to embodiments of the present disclosure.

Referring to FIGS. 4 and 5, the touch display device 100 according to embodiments of the present disclosure can intactly utilize components (e.g., data lines, gate lines, etc.) for display function and signals (e.g., gate signals (GATE)) for driving the component without modification, thereby providing a touch sensing function.

Referring to FIGS. 4 and 5, the data driving circuit 120 can include a source driving circuit 410 for display function and a sensing circuit 420 for touch sensing function.

The source driving circuit 410 outputs the image data voltages VDATA to a plurality of data lines DL through output buffers BUF.

The sensing circuit 420 can sense a plurality of data lines DL by grouping every N data lines (N is a natural number of 2 or more). Hereinafter, it is assumed that N is 48 as an example.

Referring to FIGS. 4, 5 and 6, when the sensing circuit 420 senses N data lines (when N=48, DL #1 to DL #48) included in a first data line group DLG among a plurality of data line groups DLG in which every N data lines form a group, the gate driving circuit 130 can output M gate signals GATE sequentially having a pulse section PT in timings to M (M is a natural number of 2 or more) gate lines (when M=12, GL #1 to GL #12) among a plurality of gate lines GL. The pulse section PT can include two or more pulses (P1, P2, . . . ). Hereinafter, it is assumed that M is 12.

Referring to FIGS. 4, 5 and 6, gate signals GATE applied to each of the plurality of gate lines GL can have a signal waveform that toggles two or more times during one frame time.

Referring to FIGS. 4 and 5, the data driving circuit 120 can further include a plurality of sensing timing control switches TSEN for controlling the electrical connection between a plurality of data lines DL and a source driving circuit 410.

When the source driving circuit 410 outputs the image data voltages VDATA to the plurality of data lines DL, the plurality of sensing timing control switches TSEN can disconnect a connection between the source driving circuit 410 and the plurality of data lines DL for a preset period and then connect again.

During a period in which the connection between the source driving circuit 410 and the plurality of data lines DL is disconnected by the plurality of sensing timing control switches TSEN, the sensing circuit 420 can sense N data lines (DL #1 to DL #48) included in a first data line group DLG among the plurality of data line groups DLG in which every N data lines form a group.

The period in which the plurality of sensing timing control switches TSEN are turned off can correspond to a period in which the sensing circuit 420 performs signal detection for touch sensing.

Referring to FIG. 6, the sensing timing control switch TSEN can be in a turn-on state, during a turn-off level gate voltage section that is not a pulse section PT in the gate signal GATE. During the turn-off level gate voltage section in the pulse section PT in the gate signal GATE, the sensing timing control switch TSEN can be turned off.

Referring to FIGS. 4 and 5, an area occupied by M*N sub-pixels SP where N data lines (DL #1 to DL #48) and M gate lines (GL #1 to GL #12) are connected corresponds to one touch node for touch sensing. One touch node can correspond to one touch coordinate.

Referring to FIG. 5, the sensing circuit 420 can include a plurality of analog front end circuits (AFE) 500 corresponding to a plurality of data line groups DLG, and can further include an analog-to-digital converter (ADC) 550 that converts a signal output from the plurality of analog front end circuits 500 into a digital value.

In addition, the sensing circuit 420 can be implemented in the form of an integrated circuit including a plurality of analog front end circuits 500, an analog-to-digital converter 550, and various additional components (e.g., multiplexer circuit, etc.).

In some cases, the sensing circuit 420 can further include a touch controller (900 in FIG. 9) that determines a touch and/or a touch coordinate based on sensing data including sensing values output from the analog-to-digital converter 550.

Each of the plurality of analog front end circuits 500 can include a sum circuit 510, a sum charge amplifier 520, and the like, and can further include a dual sampling integrating circuit 530, and the like.

For example, the plurality of analog front end circuits 500 can include a first analog front end circuit 500 corresponding to a first data line group DLG. The first analog front end circuit 500 includes the sum circuit 510 and the sum charge amplifier 520.

Referring to FIG. 5, the sum circuit 510 can include N sampling capacitors (when N=48, Cs1 to Cs48). The N sampling capacitors (Cs1 to Cs48) can be charged with the induced charge in the N data lines (DL #1 to DL #48) depending on the occurrence of a touch.

Referring to FIG. 5, one end a of each of the N sampling capacitors (Cs1 to Cs48) can be electrically connected to N data lines (DL #1 DL #48) included in the first data line group (DLG), and the other end b of each of the N sampling capacitors (Cs1 to Cs48) can be electrically connected to each other.

Referring to FIG. 5, the sum charge amplifier 520 can include an operational amplifier OPAMP including a sensing input terminal SIN to which all the other ends b of each of the N sampling capacitors (Cs1 to Cs48) are electrically connected, a reference input terminal RIN to which a reference voltage VREF_SUM is applied, a sensing output terminal OUT_SUM for outputting a sum output signal Vsum; a feedback capacitor Cfb_SUM connected between the sensing output terminal OUT_SUM and the sensing input terminal SIN of the operational amplifier OPAMP; and a sum reset switch RST SUM connected between the sensing output terminal OUT_SUM of the operational amplifier OPAMP and the sensing input terminal SIN.

Referring to FIG. 5, the plurality of sensing timing control switches TSEN and the N data lines (DL #1 to DL #48) included in the first data line group DLG can be electrically connected in first points (when N=48, X1 to X48).

Between the N data lines (DL #1 to DL #48) included in the first data line group DLG and the first points (X1 to X48), one ends a of N sampling capacitors (Cs1 to Cs48) can be respectively connected.

That is, the points (Z1 to Z48) in which the N data lines (DL #1 to DL #48) included in the first data line group DLG and one end a of each of the N sampling capacitors (Cs1 to Cs48) are connected are positioned between the N data lines (DL #1 to DL #48) included in the first data line group DLG and the first points (X1 to X48).

Referring to FIGS. 4 to 6, during a first period within one frame time, the gate driving circuit 130 can sequentially output gate signals GATE, which sequentially have a pulse section PT, to M gate lines (GL #1, GL #2, . . . , GL #i, GL #(i+1), . . . , GL #12) intersecting the N data lines (DL #1 to DL #48) included in the first data line group DLG.

The pulse section PT of each gate signal GATE can correspond to, for example, one horizontal time (1H), and can be a signal section for turning on a transistor (e.g., SCT, SENT) connected to a corresponding gate line GL, as a signal section for opening the corresponding gate line GL.

In general, during one frame time, one gate signal GATE has one section (turn-on level gate voltage section) having a turn-on level gate voltage Vgate_on, which can be a high level voltage, and has a turn-off level gate voltage section having a turn-off level gate voltage Vgate_off, which can be a low level voltage, except for the turn-on level gate voltage section.

On the other hand, during one frame time, the gate signal GATE according to embodiments of the present disclosure has two or more sections (hereinafter, a turn-on level gate voltage section) having a turn-on level gate voltage Vgate_on. In the gate signal GATE according to embodiments of the present disclosure, the pulse section PT includes two or more turn-on level gate voltage (Vgate_on) sections and one or more turn-off level gate voltage (Vgate_off) sections.

Referring to FIG. 6, the pulse section PT of each gate signal GATE can include two or more pulses (P1, P2). The pulse section PT of each of the gate signals GATE can include two or more turn-on level gate voltage sections having a turn-on level gate voltage (Vgate_on) and one or more turn-off level gate voltage sections having a turn-off level gate voltage (Vgate_off). Accordingly, the pulse section PT of each of the gate signals GATE includes two or more pulses (P1, P2).

Referring to FIG. 6, the pulse section PT of each gate signal GATE has an amplitude ΔV for achieving a touch driving. That is, a voltage difference ΔV between the turn-on level gate voltage Vgate_on and the turn-off level gate voltage Vgate_off has a value that enables to achieve a touch driving.

Accordingly, during a first period within one frame time, when the pulse section PT of each of the gate signals GATE output to the M gate lines (GL #1 to GL #12) is sequentially added, it can serve as touch drive pulses supplied to one touch node.

As described above, within one frame time, during the pulse section PT including two or more pulses P1 and P2 in each of the gate signals GATE, the plurality of sensing timing control switches TSEN can have one or more turn-off states, as shown in FIG. 6.

In other words, in the gate signals GATE applied to the gate lines GL in the display panel 110, voltage can be toggled two or more times in one frame time. For example, first toggling for generating a first pulse P1 means that the turn-off level gate voltage (Vgate_off) before the pulse section PT is changed to first turn-on level gate voltage Vgate_on in the pulse section PT, and then changed again to the turn-off level gate voltage Vgate_off. Secondary toggling for generating a second pulse P2 means that the turn-off level gate voltage Vgate_off in the pulse section PT is changed to the second turn-on level gate voltage Vgate_on, and then changed again to the turn-off level gate voltage Vgate_off.

Referring to FIGS. 4 to 6, during a first period within one frame time, the data driving circuit 120 can output image data voltages VDATA to the N data lines (DL #1 to DL #48) included in the first data line group DLG.

Referring to FIG. 6, the touch display device 100 according to embodiments of the present disclosure can sense a touch while the display is driving. That is, in the touch display device 100 according to embodiments of the present disclosure, a display mode for a display function and a touch mode for a touch sensing function can be simultaneously performed.

Referring to FIG. 6, a gate signal applied to the i-th gate line GL #i among the M gate lines (GL #1 to GL #12) is illustrated to describe a display mode and a touch mode that are simultaneously performed.

Referring to FIG. 6, in the gate signal GATE applied to the i-th gate line GL #i among the M gate lines (GL #1 to GL #12), the pulse section PT includes two turn-on level gate voltage sections and one turn-off level gate voltage section between the two turn-on level gate voltage sections.

The sensing timing control switch TSEN is turned off during the first turn-on level gate voltage section in the pulse section PT, in the gate signal GATE applied to the i-th gate line GL #i. Then, the sensing timing control switch TSEN is turned on again, after a second turn-on level gate voltage section in the pulse section PT, in the gate signal GATE applied to the i-th gate line GL #i.

The time section in which the sensing timing control switch TSEN is turned off means the touch sensing period T, and the time section in which the sensing timing control switch TSEN is turned on means the display driving period D.

In order to describe the display mode operation, it is assumed that the gate signal GATE applied to the i-th gate line GL #i is a scan signal SCAN of FIG. 2.

Simultaneous operation of the display mode and the touch mode will be described below.

Referring to FIG. 6, during first turn-on level gate voltage section having first turn-on level gate voltage Vgate_on in the pulse section PT of the gate signal GATE applied to the i-th gate line GL #i, first data write operation for a display mode is performed.

Referring to FIG. 6, the pulse section PT of the gate signal GATE applied to the i-th gate line GL #i is a timing at which the i-th gate line GL #i is scanned. The first turn-on level gate voltage section in the pulse section PT of the gate signal GATE applied to the i-th gate line GL #i can correspond to the first pulse P1 in the pulse section PT.

Referring to FIG. 6, the scan transistor SCT in the sub-pixels SP corresponding to the i-th gate line GL #i is turned on, by the first turn-on level gate voltage Vgate_on in the pulse section PT in the gate signal GATE applied to the i-th gate line GL #i. Then, the image data voltage VDATA output from the source driving circuit 410 is supplied to the N data lines (DL #1 to DL #48) intersecting the i-th gate line GL #i, through the sensing timing control switch TSEN that is turned on.

According to the gate driving and data driving operations, the image data voltage VDATA supplied to each of the N data lines (DL #1 to DL #48) can be applied to the first node n1 of the driving transistor DRT in the sub-pixels SP corresponding to the i-th gate line GL #i, through the scan transistor SCT turned on by the first turn-on level gate voltage Vgate_on in the pulse section PT of the gate signal GATE. As described above, the applying of the image data voltage VDATA to the first node n1 of the driving transistor DRT is called data writing.

A first data write operation period corresponds to a display driving period D. At this time, the sensing timing control switch TSEN is in a turn-on state. Further, during the first data write operation period, it is a reset state in which the operation of the touch mode is not performed.

Referring to FIG. 6, during the first turn-on level gate voltage section having the first turn-on level gate voltage Vgate_on in the pulse section PT of the gate signal GATE applied to the i-th gate line GL #i, the sensing timing control switch TSEN is turned off. Accordingly, the touch sensing period T starts.

As the sensing timing control switch TSEN is turned off, the N data lines (DL #1 to DL #48) intersecting the i-th gate line GL #i is disconnected with the source driving circuit 410, and is connected to the sensing circuit 420.

That is, as the sensing timing control switch TSEN is turned off, the N data lines (DL #1 to DL #48) cannot receive the image data voltage VDATA from the source driving circuit 410. However, the N data lines (DL #1 to DL #48) can be in a state where the image data voltage VDATA supplied during the first data write operation period is maintained to some extent.

As the supply of the image data voltage VDATA to the N data lines (DL #1 to DL #48) is stopped, the first node n1 of the driving transistor DRT in the sub-pixels SP corresponding to the i-th gate line GL #i becomes an electrical floating state. At this time, due to a storage capacitor Cst, the first node n1 of the driving transistor DRT is held by the image data voltage VDATA applied during the first data write operation period. This is referred to as a data hold operation.

After the sensing timing control switch TSEN is turned off and the data hold operation is started, within the pulse section PT of the gate signal GATE applied to the i-th gate line GL #i, the first turn-on level gate voltage Vgate_on is changed to the turn-off level gate voltage Vgate_off.

Accordingly, the scan transistor SCT that is turned on by the first turn-on level gate voltage Vgate_on in the pulse section PT in the gate signal GATE applied to the i-th gate line GL #i is turned off by the turn-off level gate voltage Vgate_off. This turn-off of the scan transistor SCT maintains the floating state of the first node n1 of the driving transistor DRT in the sub-pixels SP corresponding to the i-th gate line GL #i included in the M gate lines (GL #1 to GL #12), and allow the data hold operation to continue.

Referring to FIG. 6, the second turn-on level gate voltage section proceeds after a turn-off level gate voltage section of a certain time length in the pulse section PT of the gate signal GATE applied to the i-th gate line GL #i. As described above, as the gate signal GATE applied to the i-th gate line GL #i becomes the second turn-on level gate voltage Vgate_on, the scan transistor SCT in the sub-pixels SP corresponding to the i-th gate line GL #i is turned on. However, until the sensing timing control switch TSEN is turned on, it corresponds to the touch sensing period T, and the data hold operation is continued.

Referring to FIG. 6, when the gate signal GATE applied to the i-th gate line GL #i becomes the second turn-on level gate voltage Vgate_on and a certain time is elapsed, the sensing timing control switch TSEN can be turned on. Accordingly, the touch sensing period T is terminated and the display driving period D proceeds again.

As the sensing timing control switch TSEN is turned on, the N data lines (DL #1 to DL #48) are connected to the source driving circuit 410 again, and the image data voltage VDATA is supplied again from the source driving circuit 410.

During the display driving period D, since the gate signal GATE applied to the i-th gate line GL #i has a second turn-on level gate voltage Vgate_on, the scan transistor SCT in the sub-pixels SP corresponding to the i-th gate line GL #i is turned on.

Accordingly, when the display driving period D proceeds, until the pulse section PT of the gate signal GATE applied to the i-th gate line GL #i is terminated (i.e., until the scanning timing of the i-th gate line GL #i is terminated), the image data voltage VDATA supplied again to each of the N data lines (DL #1 to DL #48) can be applied again to the first node n1 of the driving transistor DRT in the sub-pixels SP corresponding to the i-th gate line GL #i, through the scan transistor SCT turned on by the second turn-on level gate voltage Vgate_on in the pulse section PT of the gate signal GATE applied to the i-th gate line GL #i. This can be also referred to as a second data write operation.

During the second data write operation period, it is a reset state in which the touch mode operation does not proceed.

Referring to FIG. 6, the gate signal GATE applied to the i-th gate line GL #i maintains the turn-off level gate voltage Vgate_off until the next frame, after the pulse section PT is terminated.

Referring to FIG. 6, during the scanning timing period for the (i+1)-th gate line GL #(i+1), the same operation as the above described operation during the scanning timing period for the i-th gate line GL #i proceeds.

As described above, since the display mode and touch mode operations are simultaneously performed, the touch can be sensed simultaneously while driving the display. In addition, since the separately generated turn-off level gate voltage section in the pulse section PT of the gate signal GATE is used as the touch sensing period T, the image data voltage VDATA supplied into the sub-pixel SP can maintain a previous value.

Therefore, in the separately generated turn-off level gate voltage section in the pulse section PT of the gate signal GATE, since the sensing timing control switch TSEN is in a turn-off state even if a change of N data lines (DL #1 to DL #48) occur, it does not affect touch sensing.

In addition, the image data voltage VDATA can be finally written in the second turn-on level gate voltage section in the pulse section PT of the gate signal GATE, thereby preventing image distortion.

Referring to FIG. 6, the timing or temporal length of the turn-off level gate voltage section in the pulse section PT of the gate signal GATE can vary according to resolution, quality of touch sensing, and the like.

In addition, the temporal length of the turn-off level gate voltage section in the pulse section PT of the gate signal GATE can be secured as long as possible in a range in which image quality is not degraded.

In addition, the temporal lengths of the first turn-on level gate voltage section and the second turn-on level gate voltage section in the pulse section PT of the gate signal GATE can be the same, or be different.

Meanwhile, the touch sensing method according to embodiments of the present disclosure is a method of sensing a touch based on mutual capacitance between a plurality of data lines DL and a plurality of gate lines GL.

The touch sensing method according to the embodiments of the present disclosure is a method of sensing a touch based on the capacitance of a plurality of touch nodes, by treating the sum of the capacitances formed between N data lines (DL #1 to DL #48) and M gate lines (GL #1 to GL #12) as the capacitance of one touch node, since the mutual capacitance formed between one data line DL and one gate line GL can be too small.

In the touch sensing method according to the embodiments of the present disclosure, it can be seen that a group of M gate lines (GL #1 to GL #12) corresponds to one drive electrode (or a transmission Tx electrode), and a group (data line group DLG) of N data lines (DL #1 to DL #48) corresponds to one sensing electrode (or a reception Rx electrode).

As described above, the touch display device 100 according to embodiments of the present disclosure sequentially drives the M gate lines (GL #1 to GL #12) like one drive electrode in a touch sensing principle, and finds out the mutual capacitance between the M gate lines (GL #1 to GL #12) and the N data lines (DL #1 to DL #48) that form one touch node and the change thereof by sensing the N data lines (DL #1 to DL #48) simultaneously like one sensing electrode, thereby being able to sense a touch and/or touch coordinates.

Accordingly, during the first period within one frame time, the sum charge amplifier 520 can output a sum output signal Vsum corresponding to the mutual capacitances between N data lines (DL #1 to DL #48) included in the first data line group DLG and M gate lines (GL #1 to GL #12).

Meanwhile, each of the source driving circuit 410 and the sensing circuit 420 included in the data driving circuit 120 can be implemented as separate integrated circuits (ICs). Alternatively, the source driving circuit 410 and the sensing circuit 420 included in the data driving circuit 120 can be integrated and implemented as a single integrated circuit.

Figure 7:
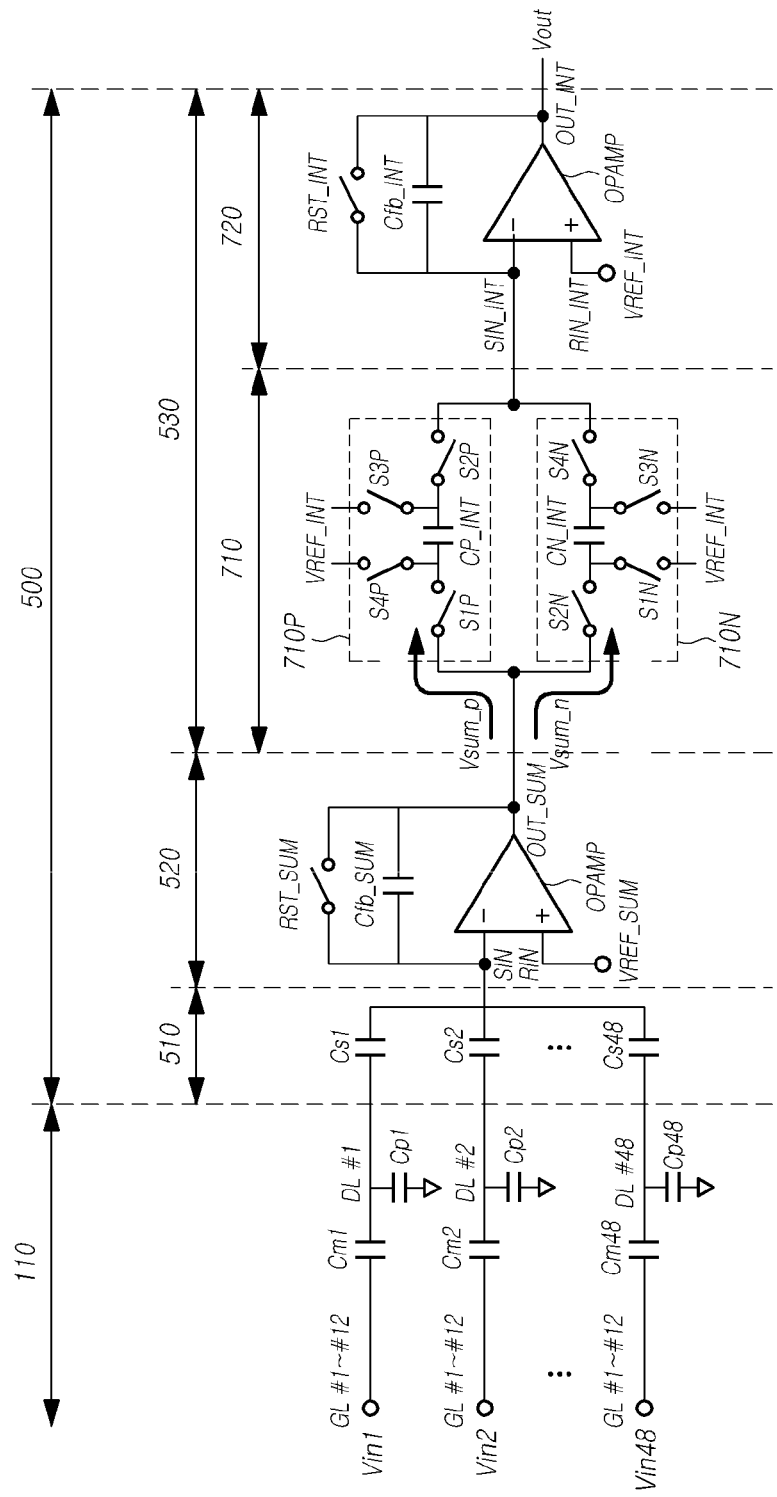
FIG. 7 is a diagram illustrating an analog front end circuit included in a sensing circuit of a touch display device according to embodiments of the present disclosure.
Figure 8:
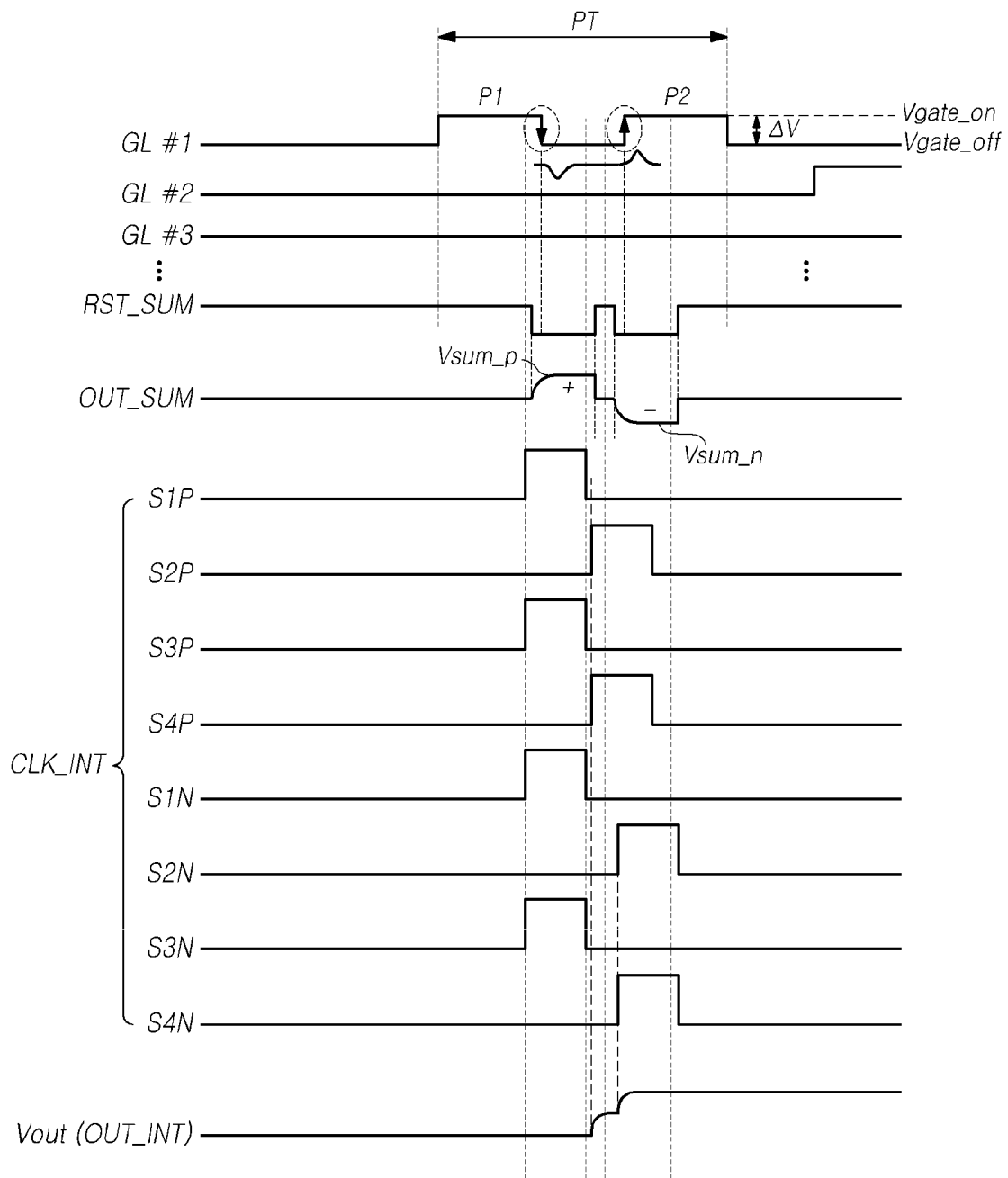
FIG. 8 is a touch driving timing diagram of a touch display device according to embodiments of the present disclosure.

FIG. 7 is a diagram illustrating an analog front end circuit 500 included in a sensing circuit 420 of a touch display device 100 according to embodiments of the present disclosure, and FIG. 8 is a touch driving timing diagram of a touch display device 100 according to embodiments of the present disclosure.

The analog front end circuit 500 of the sensing circuit 420 senses the N data lines (DL #1 to DL #48) simultaneously, while the M gate lines (GL #1 to GL #12) are sequentially driven.

As the M gate lines (GL #1 to GL #12) are sequentially driven, touch drive pulses can be formed as input signals (Vin1 to Vin48), through the M gate lines (GL #1 to GL #12) that intersect with each of the N data lines (DL #1 to DL #48).

For example, as the M gate lines GL #1 to GL #12 are sequentially driven, a first input signal Vin1 in the form of touch drive pulses is formed in terms of the first data line DL #1 in the M gate lines (GL #1 to GL #12) that intersect with the first data line DL #1.

Since each of the N data lines (DL #1 to DL #48) intersects with all the M gate lines (GL #1 to GL #12), each of the N data lines (DL #1 to DL #48), together with the M gate lines (GL #1 to GL #12), forms capacitances (Cm1 to Cm48).

For example, since the first data line DL #1 intersects all of the M gate lines (GL #1 to GL #12), in the first data line DL #1 and the M gate lines (GL #1 to GL #12), M capacitances are formed, and the first capacitance Cm1 is formed in a form that M capacitances are combined. For another example, since the second data line DL #2 intersects all of the M gate lines (GL #1 to GL #12), in the second data line DL #2 and the M gate lines (GL #1 to GL #12), M capacitances are formed, and the second capacitance Cm2 is formed in a form that M capacitances are combined.

The N data lines (DL #1 to DL #48) can have parasitic capacitance components (Cp1 to Cp48). The M gate lines (GL #1 to GL #12) can also have parasitic capacitance components.

The N data lines (DL #1 to DL #48) can be connected to the sum circuit 510 in the analog front end circuit 500. In a situation where the M gate lines (GL #1 to GL #12) are sequentially driven, different charges can be induced in the N data lines (DL #1 to DL #48), depending on the presence or absence of a surrounding touch object (e.g., finger, pen, etc.). The charge induced in the N data lines (DL #1 to DL #48) can be charged in the N sampling capacitors (Cs1 to Cs48) in the sum circuit 510.

In the following, the detailed structure and operation of the analog front end circuit 500 will be described in detail below.

Referring to FIG. 7, each of the plurality of analog front end circuits 500 corresponding to the plurality of data line groups DLG can further include a dual sampling integrating circuit 530, in addition to the sum circuit 510 and the sum charge amplifier 520.

The structures of each of the sum circuit 510 and the sum charge amplifier 520 are described with reference to FIG. 5, and the dual sampling integrating circuit 530 will be described in more detail below. However, the first data line group DLG among the plurality of data line groups DLG in which all the data lines DL disposed in the display panel 110 are grouped for every N will be illustrated, and the first analog front end circuit 500 corresponding to the first data line group DLG the will be described.

The first analog front end circuit 500 can include a sum circuit 510, a sum charge amplifier 520, and a dual sampling integrating circuit 530.

Referring to FIG. 7, the dual sampling integrating circuit 530 is electrically connected to a sensing output terminal OUT_SUM of the sum charge amplifier 520, receives a positive sum output signal Vsum_p and a negative sum output signal Vsum n of the sum charge amplifier 520 via a positive path and a negative path respectively, from the sensing output terminal OUT_SUM of the sum charge amplifier 520, invert the negative sum output signal Vsum n to sum with the positive sum output signal Vsum_p, and integrates the summed signal and outputs the integrated signal as an analog sensing value Vout in the form of an analog value.

The dual sampling integrating circuit 530 can include a dual sampling switch circuit 710 and an integrator 720.

The dual sampling switch circuit 710 can include a positive sampling switch circuit 710P and a negative sampling switch circuit 710N.

The integrator 720 can include an operational amplifier OPAMP having an integral input terminal SIN_INT connected to the output terminal of the dual sampling switch circuit 710, an integral reference input terminal RIN INT to which an integral reference voltage VREF_INT is applied, and an integral output terminal OUT_INT for outputting an analog sensing value Vout corresponding to an integral value, an integral capacitor Cfb_INT connected between the integral input terminal SIN_INT and the integral output terminal OUT_INT, and an integral reset switch RST_INT connected between the integral input terminal SIN_INT and the integral output terminal OUT_INT.

A positive sampling switch circuit 710P and a negative sampling switch circuit 710N can be connected in parallel between the sensing output terminal OUT_SUM of the sum charge amplifier 520 and the integral input terminal SIN_INT of the integrator 720.

The positive sampling switch circuit 710P can include a positive sampling capacitor CP_INT, a first positive switch SP connected between one end of the positive sampling capacitor CP_INT and the sensing output terminal OUT_SUM of the sum charge amplifier 520, a second positive switch S2P connected between the other end of the positive sampling capacitor CP_INT and the integral input terminal SIN_INT of the integrator 720, a third positive switch S3P connected between the other end of the positive sampling capacitor CP_INT and the integral reference voltage node to which the integral reference voltage VREF_INT is applied, and a fourth positive switch S4P connected between one end of the positive sampling capacitor CP_INT and the integral reference voltage node to which the integral reference voltage VREF_INT is applied.

The negative sampling switch circuit 710N can include a negative sampling capacitor CN_INT, a first negative switch SIN connected between one end of the negative sampling capacitor CN_INT and an integral reference voltage node to which the integral reference voltage VREF_INT is applied, a second negative switch S2N connected between one end of the negative sampling capacitor CN_INT and the sensing output terminal OUT_SUM of the sum charge amplifier 520, a third negative switch S3N connected between the other end of the negative sampling capacitor CN_INT and the integral reference voltage node to which the integral reference voltage VREF_INT is applied, and a fourth negative switch 54N connected between the other end of the negative sampling capacitor CN_INT and the integral input terminal SIN_INT of the integrator 720.

The positive sampling switch circuit 710P stores the positive sum output signal Vsum_p in the positive sampling capacitor CP_INT, and can output the positive sum output signal Vsum_p stored in the positive sampling capacitor CP_INT to the integral input terminal SIN_INT of the integrator 720.

The negative sampling switch circuit 710N can invert the negative sum output signal Vsum n, and output it to the integral input terminal SIN_INT of the integrator 720 to which the positive sum output signal Vsum_p is input.

The positive sum output signal Vsum_p is a sum output signal Vsum having a positive phase. The negative sum output signal Vsum n is a sum output signal Vsum having a negative phase.

The positive sum output signal Vsump of the sum charge amplifier 520 can be a signal output from the sum charge amplifier 520, when the gate signal GATE falls from a high level voltage to a low level voltage among the turn-on level gate voltage Vgate_on and the turn-off level gate voltage Vgate_off.

The negative sum output signal Vsum n of the sum charge amplifier 520 can be a signal output from the sum charge amplifier 520, when the gate signal GATE rises from a low level voltage to a high level voltage among the turn-on level gate voltage Vgate_on and the turn-off level gate voltage Vgate_off.

Referring to FIG. 8, the on-off operation of first to fourth positive switches S1P, S2P, S3P, and S4P and first to fourth negative switches S1N, S2N, S3N, and 54N can be controlled by clock signals CLK INT.

When the gate signal GATE falls from the high level voltage to the low level voltage among the turn-on level gate voltage Vgate_on and the turn-off level gate voltage Vgate_off, the first positive switch SP and the third positive switch S3P can be turned on, and the first negative switch SIN and the third negative switch S3N can be turned off.

After the gate signal GATE falls from the high level voltage to the low level voltage among the turn-on level gate voltage Vgate_on and the turn-off level gate voltage Vgate_off, the second positive switch S2P and the fourth positive switch S4P can be turned on.

When the gate signal GATE rises from the low level voltage to the high level voltage among the turn-on level gate voltage Vgate_on and the turn-off level gate voltage Vgate_off, the second negative switch S2N and the fourth negative switch S4N can be turned on.

Each of clock signals CLK INT controlling the on-off operation of the first to fourth positive switches S1P, S2P, S3P, and S4P and the first to fourth negative switches SIN, S2N, S3N, and 54N can have basically the same duty and width.

However, one or more of the duty and width of each of clock signals CLK INT controlling the on-off operation of the first to fourth positive switches S1P, S2P, S3P, and S4P and the first to fourth negative switches S1N, S2N, S3N, and S4N can be varied in order to obtain an analog sensing value Vout of a stepped waveform in which the voltage rises step by step in a desired form.

The analog sensing value Vout starts to be output from the rising timing of the second positive switch S2P and the fourth positive switch S4P.

The second negative switch S2N and the fourth negative switch S4N invert and output the negative sum output signal Vsum n. Such an inverted and output signal is summed with the signal output at the rising time of the second positive switch S2P and the fourth positive switch S4P, so that the analog sensing value Vout has a stepped waveform.

Meanwhile, referring to FIG. 8, among the turn-on level gate voltages having the turn-on level gate voltage Vgate_on in the pulse section PT of the gate line GL, the sum reset switch RST SUM included in the sum charge amplifier 520 can be changed from the turn-off state to the turn-on state, and can be changed again to the turn-off state.

In addition, during a period (touch sensing period T) in which the sensing timing control switch TSEN is in a turn-off state, the sum reset switch RST SUM is changed from the turn-off state to the turn-on state, and changed again to the turn-off state.

Meanwhile, the integral reset switch RST_INT in the integrator 720 can be turned on and off at the same timing as the first positive switch SW and the third positive switch S3P, when a preset integral number of times is completed. However, the first positive switch SW and the third positive switch S3P are periodically repeated for every pulse (which can be a touch drive pulse formed by the pulse section PT of the gate signals GATE), but the integral reset switch RST_INT performs a switching operation only once when a desired integral number of times is completed.

Referring to FIGS. 7 and 8, the sum output signal Vsum output from the sum charge amplifier 520 of the analog front end circuit 500 can be represented by Equation 1 below. However, it is assumed that one gate line GL is driven.

$$Vsum = \Delta Vin \times \frac{Cm}{Cs + Cm + Cp} \times \frac{Cs}{Cf} + \text{VREF\_SUM} \quad \text{[Equation 1]}$$

In Equation 1, Vsum is a sum output signal output from the sum charge amplifier 520. ΔVin is the amplitude of the touch drive pulses, and is one of Vin1 to Vin48. Cm is a mutual capacitance formed between the corresponding data line DL and the gate lines GL, and is one of Cm1 to Cm48. Cs is the capacitance of a corresponding sampling capacitor among the sampling capacitors Cs1 to Cs48. Cp is a parasitic capacitance of a corresponding data line DL, and is one of Cp1 to Cp48. Cf is the capacitance of a feedback capacitor Cfb_SUM of the sum charge amplifier 520. VREF_SUM is a reference voltage input to the reference input terminal RIN of the sum charge amplifier 520.

For example, assuming that Cs=300 fF, Cm=5 fF, Cf=100 fF, Cp=250 pF, ΔVin=25V, Cs/Cf=3, VREF_SUM=5V, M (the number of gate lines corresponding to one touch node)=12, N (the number of data lines corresponding to one touch node)=48, and the number of voltage variation in the pulse section PT is 2 times (rising number+falling number), and assuming that ΔCm=0.25 fF (5%) which is a difference between Cm in the case of a touch and no touch, the sum output signal Vsum for each of a touch case and no touch case is calculated as follows.

Vsum=(5/250305)×25×3×48×2+VREF_SUM=143.82 mV+VREF_SUM in the case of no touch

Vsum=(4.75/250304.95)×25×3×48×2+ VREF_SUM=136.63 mV+VREF_SUM in the case of a touch Therefore, in the case of a touch and no touch, the deviation of the sum output signal Vsum is 7.19 mV (based on one gate line). Considering the case where M=12, which is the number of gate lines corresponding to one touch node, in the case of a touch and no touch, the deviation of the sum output signal Vsum becomes 86.28 mV (based on 12 gate lines).

In the case of a touch and no touch, as the deviation of the sum output signal Vsum becomes larger, the touch sensing performance can be enhanced. To this end, the capacitance Cs of the sampling capacitor, the mutual capacitance Cm formed between a corresponding data line DL and the gate lines GL, ΔCm which is the difference value of Cm in the case of a touch and no touch, and the like can be controlled, and Cp, the gain value of the integrator 720, the gate voltage (Vgate_on, Vgate_off), and the like can be adjusted.

The analog sensing value Vout output by the dual sampling integrating circuit 530 can be expressed by Equations 2 to 5 below.

Equation 2 below is an analog sensing value Vout (falling, 1stGate) based on one gate line GL, when one of the first gate line (GL #1) is driven, when falling from the turn-on level gate voltage Vgate_on in the pulse section PT of the gate signal GATE to the turn-off level gate voltage Vgate_off. This has a positive value. ΔVin1 to ΔVin48 are the amplitudes of the touch drive pulses, and corresponds to Vin1 to Vin48. Cs_INT is the capacitance of the positive sampling capacitor CP_INT and the negative sampling capacitor CN_INT in the dual sampling switch circuit 710. Cf INT is the capacitance of the integral capacitor Cfb_INT in the integrator 720.

Equation 3 below is an analog sensing value Vout (rising, 1stGate) based on one gate line GL, when one first gate line GL #1 is driven, when rising from the turn-off level gate voltage Vgate_off in the pulse section PT of the gate signal GATE to the turn-on level gate voltage Vgate_on. This has a negative value.

$$Vout(\text{falling, 1stGate}) = (\Delta Vin1 + \Delta Vin2 + \ldots + \Delta Vin48) \times \quad \text{[Equation 2]}$$
$$\frac{Cm}{Cs + Cm + Cp} \times \frac{Cs}{Cf} \times \frac{Cs\_INT}{Cf\_INT}$$

$$Vout(\text{rising, 1stGate}) = -(\Delta Vin1 + \Delta Vin2 + \ldots + \Delta Vin48) \times \quad \text{[Equation 3]}$$
$$\frac{Cm}{Cs + Cm + Cp} \times \frac{Cs}{Cf} \times \frac{Cs\_INT}{Cf\_INT}$$

$$Vout(\text{1stGate}) = Vout(\text{falling, 1gate}) - Vout(\text{rising, 1gate}) \quad \text{[Equation 4]}$$

$$Vout(\text{total}) = Vout(\text{1stGate}) + \quad \text{[Equation 5]}$$
$$Vout(\text{2ndGate}) + \ldots + Vout(\text{12thGate}) + \text{VREF\_INT}$$

Equation 4 is the total analog sensing value Vout (1stGate), when one first gate line GL #1 is driven. Equation 5 is the total analog sensing value Vout (total), when 12 (M=12) gate lines (GL #1 to GL #12) are sequentially driven. VREF_INT is an integral reference voltage applied to the integral reference input terminal RIN INT of the integrator 720.

Figure 9:
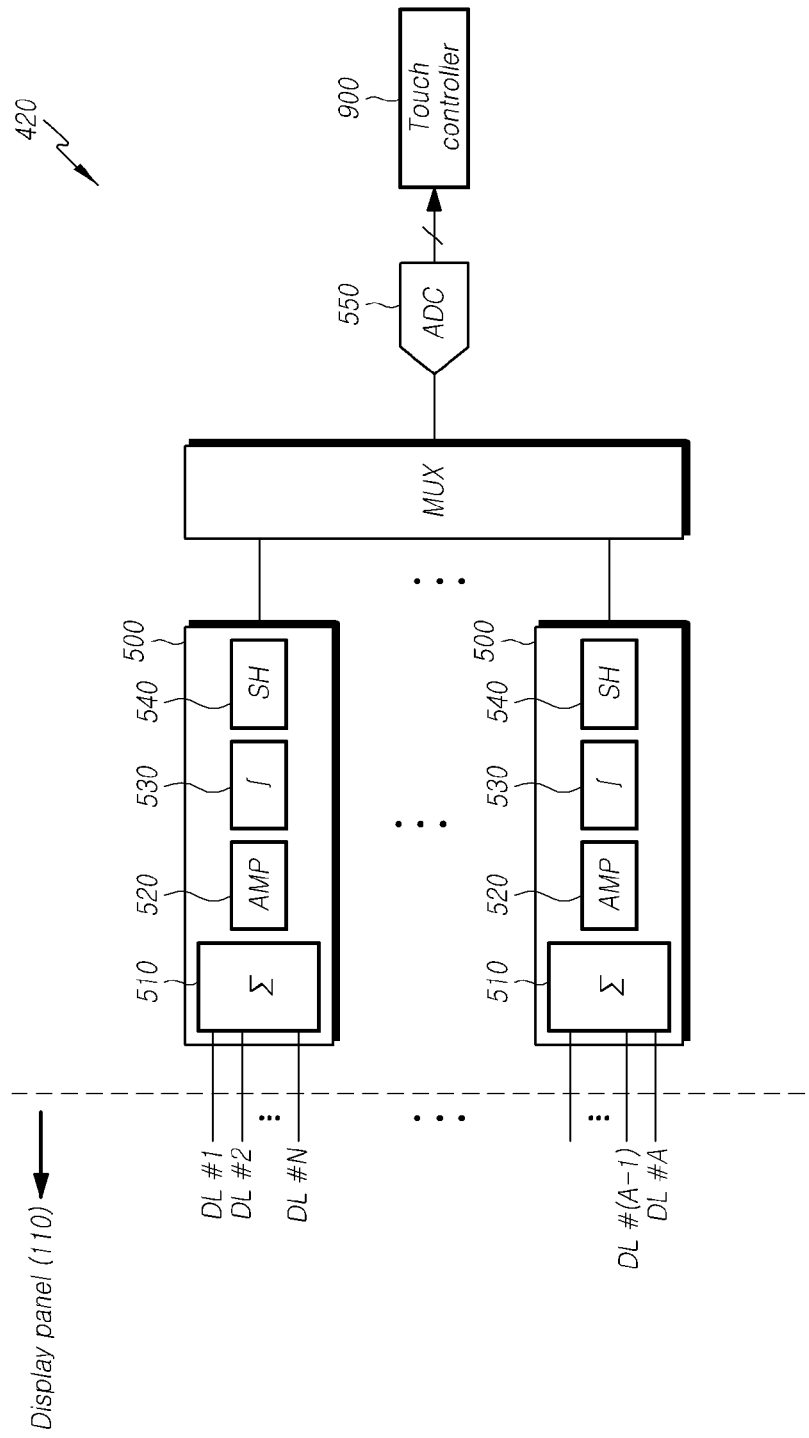
FIG. 9 is a block diagram of an overall touch sensing system of a touch display device according to embodiments of the present disclosure.

FIG. 9 is a block diagram of an overall touch sensing system of a touch display device according to embodiments of the present disclosure.

Referring to FIG. 9, a touch sensing system of the touch display device 100 according to embodiments of the present disclosure includes a plurality of analog front end circuits 500 described above, and can further include a multiplexer circuit MUX for selecting one of a plurality of analog front end circuits 500, and an analog-to-digital converter (ADC) 550 that converts the analog sensing value Vout output from the analog front end circuit 500 selected by the multiplexer circuit MUX into a digital sensing value Referring to FIG. 9, as described above, each of the plurality of analog front end circuits 500 corresponds to N data lines. For example, when a total of A data lines (DL #1 to DL #A) are disposed in the display panel 110, the first analog front end circuit 500 senses N data lines (DL #1 to DL #N) included in the first data line group DLG among the A data lines (DL #1 to DL #A). The last analog front end circuit 500 senses N data lines ( . . . , DL #(A−1), DL #A) included in the last data line group DLG among the A data lines (DL #1 to DL #A).

Referring to FIG. 9, the touch sensing system of the touch display device 100 according to embodiments of the present disclosure can further include a touch controller 900 that receives sensing data including digital sensing values obtained from the analog-to-digital converter 550 and determines a touch and/or a touch coordinate.

Referring to FIG. 9, each analog front end circuit 500 can further include a sample-and-hold circuit (SH) 540 that holds and stores the analog sensing value Vout output from the dual sampling integrating circuit 530.

Figure 10:
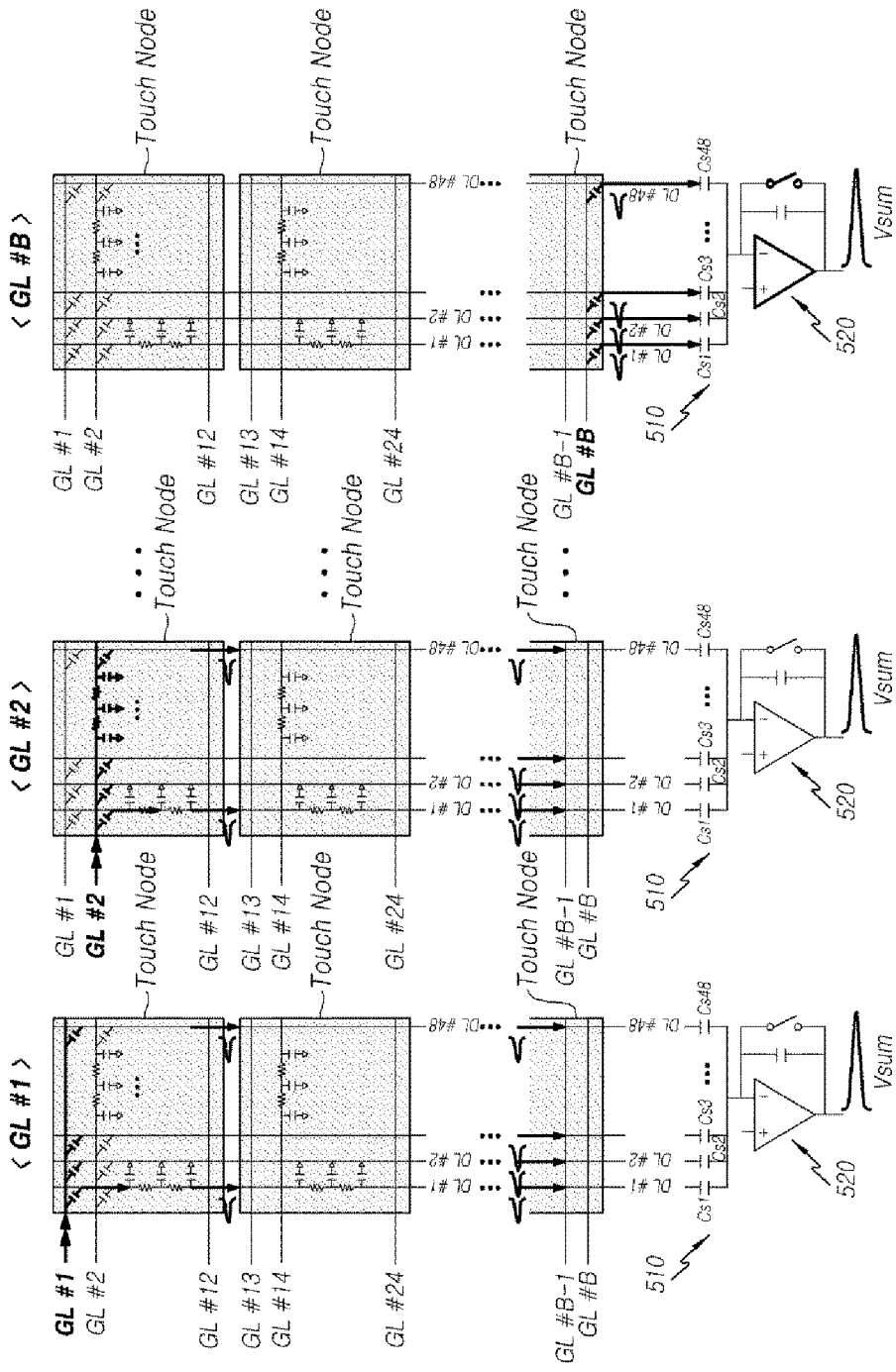
FIG. 10 is a diagram illustrating a sensing operation for touch node areas of a touch display device according to embodiments of the present disclosure.

FIG. 10 is a diagram illustrating a sensing operation for touch node areas of a touch display device 100 according to embodiments of the present disclosure.

Referring to FIG. 10, assuming that a total of B gate lines (GL #1 to GL #B) are disposed in the display panel 110, and assuming that B gate lines (GL #1 to GL #B) are grouped for every M gate lines (M=12 in the example of FIG. 10) in order to define one touch node, the area where the first to twelfth gate lines (GL #1 to GL #12) intersect with the N data lines (DL #1 to DL #48) is formed as an area of one touch node, and the area where the 13th to 24th gate lines (GL #13 to GL #24) intersect with the N data lines (DL #1 to DL #48) is formed as an area of the next touch node. Further, the area where the last 12 gate lines ( . . . , GL # (B−1), GL #B) and N data lines (DL #1 to DL #48) intersect is formed as the area of the last touch node.

Referring to FIG. 10, the N data lines (DL #1 to DL #48) are connected to the sum circuit 510 in a corresponding analog front end circuit 500 of the sensing circuit 420.

Referring to FIG. 10, when driving the first gate line GL #1 passing through the first touch node area, signals (charges) in the N data lines (DL #1 to DL #48) are stored in N sampling capacitors (Cs1 to Cs48) of the sum circuit 510. The sum charge amplifier 520 receives signals (charges) stored in the N sampling capacitors (Cs1 to Cs48) of the sum circuit 510 through one sensing input terminal SIN, and outputs the sum output signal Vsum. Here, the sum output signal Vsum can have a signal strength obtained by signals from N data lines (DL #1 to DL #48) that are combined.

In the same manner, when driving the second gate line GL #2 passing through the first touch node area, signals (charges) in the N data lines (DL #1 to DL #48) are stored in N sampling capacitors (Cs1 to Cs48) of the sum circuit 510. The sum charge amplifier 520 receives signals (charges) stored in the N sampling capacitors (Cs1 to Cs48) of the sum circuit 510 through one sensing input terminal SIN, and outputs the sum output signal Vsum. Here, the sum output signal Vsum can have a signal strength obtained by signals from N data lines (DL #1 to DL #48) that are combined.

In the same manner, while sequentially driving from the third gate line GL #3 to the last gate line GL #B, the sum charge amplifier 520 outputs the sum output signal Vsum.

When driving the last gate line GL #B passing through the last touch node area, signals (charges) in the N data lines (DL #1 to DL #48) are stored in the N sampling capacitors (Cs1 to Cs48) of the sum circuit 510. The sum charge amplifier 520 receives signals (charges) stored in the N sampling capacitors (Cs1 to Cs48) of the sum circuit 510 through one sensing input terminal SIN, and outputs the sum output signal Vsum. Here, the sum output signal Vsum can have a signal strength obtained by signals from the N data lines (DL #1 to DL #48) that are combined.

Figure 11:
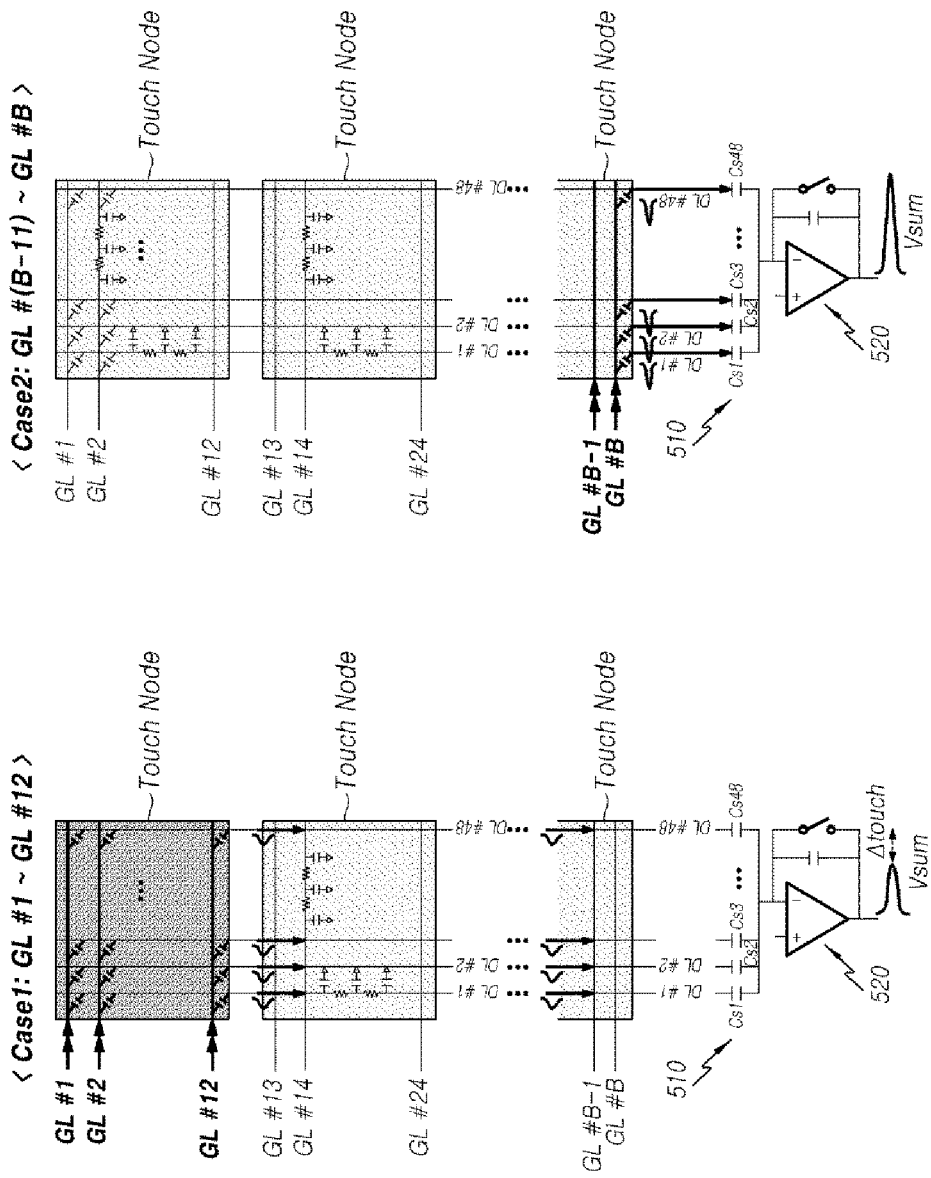
FIG. 11 is a diagram illustrating sensing of a touch node area in which a touch is generated and sensing of a touch node area in which a touch is not generated, in a touch display device according to embodiments of the present disclosure.

FIG. 11 is a diagram showing a sensing for a touch node area where a touch occurs and a sensing for a touch node area where a touch does not occur, in the touch display device 100 according to embodiments of the present disclosure. However, it is assumed that a touch occurs in a first touch node area.

Referring to FIG. 11, when M gate lines (GL #1 to GL #12) corresponding to the first touch node area where a touch occurs are sequentially driven (Case 1), the sum output signal Vsum is output from the sum charge amplifier 520 according to the sensing result through the N data lines (DL #1 to DL #48).

Thereafter, when the M gate lines ( . . . , GL #(B−1), GL #B) corresponding to the last touch node area where no touch occurs are sequentially driven (Case 2), the sum output signal Vsum is output from the sum charge amplifier 520 according to the sensing result through the N data lines (DL #1 to DL #48).

Referring to FIG. 11, the sum output signal Vsum output from the sum charge amplifier 520 when the M gate lines (GL #1 to GL #12) corresponding to the first touch node area where the touch occurs are sequentially driven, and the sum output signal Vsum output from the sum charge amplifier 520 when the M gate lines ( . . . , GL #(B−1), GL #B) corresponding to the last touch node area where no touch occurs are sequentially driven are different from each other.

Referring to FIG. 11, the sum output signal Vsum when M gate lines (GL #1 to GL #12) corresponding to the first touch node area where the touch occurs are sequentially driven can have a signal strength less than the sum output signal Vsum when M gate lines ( . . . , GL #(B−1), GL #B) corresponding to the last touch node area where the touch does not occur are sequentially driven.

The touch controller 900 can find out whether there is a touch based on a signal strength difference (Δtouch) between the sum output signal Vsum when the M gate lines (GL #1 to GL #12) corresponding to each touch node area are sequentially driven. The touch controller 900 can calculate touch coordinate by analyzing the signal strength of the sum output signal Vsum for each touch node area.

Embodiments of applying the touch sensing method according to the embodiments of the present disclosure described above to an OLED display will be described in terms of sub-pixel.

Figure 12:
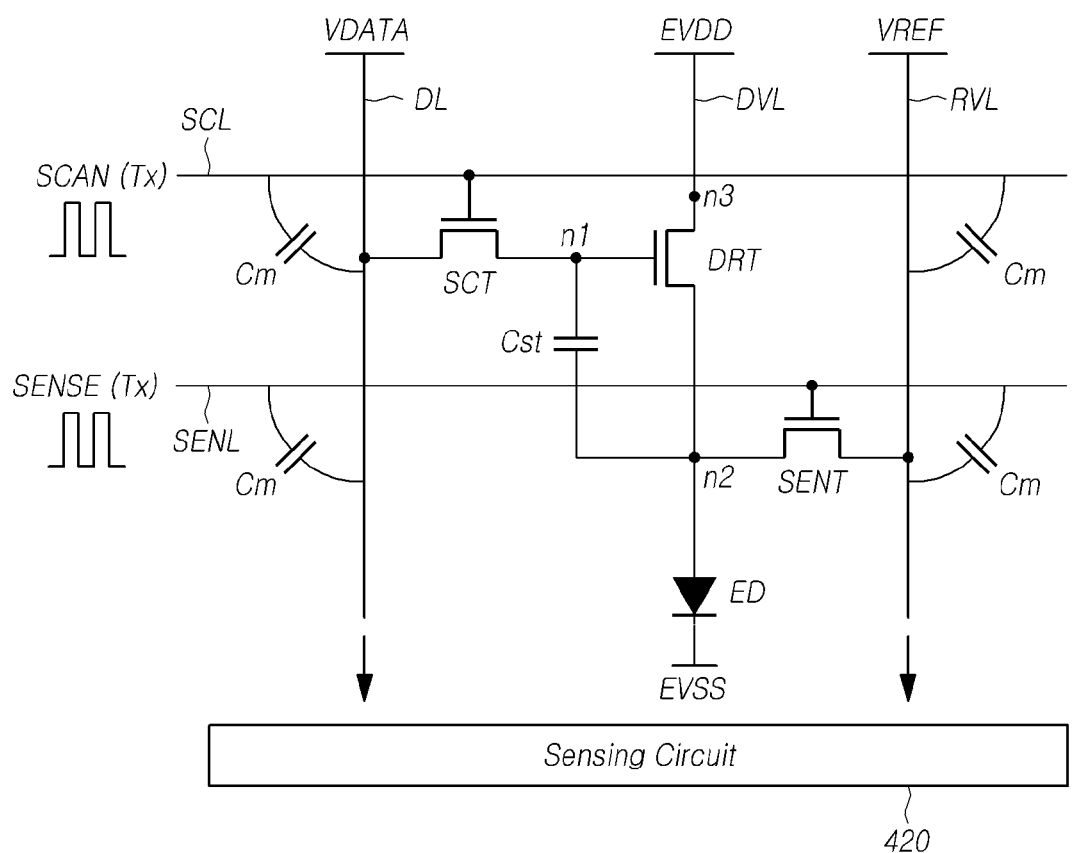
FIG. 12 is examples of a touch sensor structure for a sub-pixel having a 3T1C structure, when the touch display device according to embodiments of the present disclosure is an OLED display.

FIG. 12 is examples of a structure of a touch sensor for a sub-pixel SP when the touch display device 100 according to embodiments of the present disclosure is an organic light emitting diode (OLED) display. However, for convenience of description, it is illustrated that a sub-pixel structure is a 3T1C structure as shown in FIG. 3.

As described above, according to the touch sensing method according to the embodiments of the present disclosure, when the M gate lines (GL #1 to GL #12) are sequentially driven, N data lines (DL #1 DL #48) are sensed simultaneously. That is, M gate lines (GL #1 to GL #12) serve as one drive electrode, and N data lines (DL #1 to DL #48) serve as one sensing electrode. Accordingly, when the M gate lines (GL #1 to GL #12) are sequentially driven, two or more pulses (P1 and P2) included in each of the gate signals GATE sequentially supplied to the M gate lines (GL #1 to GL #12) are combined to serve as touch driving pulses Tx.

As an example of configuration of the drive electrode, the gate line GL used as the drive electrode can be a scan line SCL that is one type of the gate line GL in the sub-pixel SP of the 3T1C structure. In this case, touch drive pulses Tx can be generated by the scan signal SCAN applied to the scan line SCL.

As another example of the configuration of the drive electrode, the gate line GL utilized as the drive electrode can be a sense line SENL which is another type of the gate line GL in the sub-pixel SP of the 3T1C structure. In this case, touch drive pulses Tx can be generated by the sense signal SENSE applied to the sense line SENL.

As another example of the configuration of the drive electrode, the gate line GL utilized as the drive electrode can be both the scan line SCL and the sense line SENL in the sub-pixel SP of the 3T1C structure. In this case, touch drive pulses Tx are generated by the scan signal SCAN applied to the scan line SCL, and touch drive pulses Tx can also be generated by the sense signal SENSE applied to the sense line SENL.

Both the scan line SCL and the sense line SENL are display row lines disposed in a row direction. That is, one type (scan line or sense line) or both types (scan line and sense line) of display row lines can serve as a drive electrode.

According to the above, in the display panel 110 in which the sub-pixels SP of the 3T1C structure are disposed, at least one of the scan signal SCAN and the sense signal SENSE can have a pulse section PT including two or more pulses (P1, P2) within one frame time.

In other words, in the display panel 110 in which the sub-pixels SP of the 3T1C structure are disposed, at least one of the scan signal SCAN and the sense signal SENSE can have a voltage that toggles at least two times within one frame time.

For example, a first toggling for generating a first pulse P1 means that it is changed from the turn-off level gate voltage Vgate_off before the pulse section PT to the first turn-on level gate voltage Vgate_on in the pulse section PT, and changed again to the turn-off level gate voltage Vgate_off. A second toggling for generating a second pulse P2 means that it is changed from the turn-off level gate voltage Vgate_off in the pulse section PT to the second turn-on level gate voltage Vgate_on, and is changed again to the turn-off level gate voltage Vgate_off.

As described above, as an example of the configuration of the sensing electrode, the data line DL electrically connected to a drain node or a source node of the scan transistor SCT in the subpixel SP of 3T1C structure can be used as the sensing electrode. That is, in the subpixel SP of 3T1C structure, the data line DL electrically connected to the first node n1 of the driving transistor DRT through the scan transistor SCT can be electrically connected to the sensing circuit 420.

In the above, it is described that the data line DL serves as a sensing electrode. As another example, a reference voltage line RVL electrically connected to the drain node or the source node of the sense transistor SENT in the subpixel SP of 3T1C structure can be used as a sensing electrode. In this case, the reference voltage line RVL, not the data line DL, can be electrically connected to the sensing circuit 420.

Alternatively, as another example, both the data line DL and the reference voltage line RVL can be used as a sensing electrode. In this case, both the data line DL and the reference voltage line RVL can be electrically connected to the sensing circuit 420.

Both the data line DL and the reference voltage line RVL are display column lines disposed in a column direction. That is, one type (data line or reference voltage line) or both types (data line and reference voltage line) of display column lines can serve as a sensing electrode.

Referring to FIG. 12, the formation position of the mutual capacitance Cm will be described.

The mutual capacitance Cm can be formed between the scan line SCL corresponding to the drive electrode Tx and the data line DL corresponding to the sensing electrode Rx.

The mutual capacitance Cm can be formed between the scan line SCL corresponding to the drive electrode Tx and the reference voltage line RVL corresponding to the sensing electrode Rx.

The mutual capacitance Cm can be formed between the scan line SCL corresponding to the drive electrode Tx and the data line DL corresponding to the sensing electrode Rx, and the mutual capacitance Cm can be formed between the scan line SCL corresponding to the drive electrode Tx and the reference voltage line RVL corresponding to other sensing electrode Rx.

The mutual capacitance Cm can be formed between the sense line SENL corresponding to the drive electrode Tx and the data line DL corresponding to the sensing electrode Rx.

The mutual capacitance Cm can be formed between the sense line SENL corresponding to the drive electrode Tx and the reference voltage line RVL corresponding to the sensing electrode Rx.

The mutual capacitance Cm can be formed between the sense line SENL corresponding to the drive electrode Tx and the data line DL corresponding to the sensing electrode Rx, and the mutual capacitance Cm can also be formed between the sense line SENL corresponding to the drive electrode Tx and the reference voltage line RVL corresponding to the other sensing electrode Rx.

The mutual capacitance Cm can be formed between the scan line SCL corresponding to the drive electrode Tx and the data line DL corresponding to the sensing electrode Rx, and the mutual capacitance Cm can also be formed between the scan line SCL corresponding to the drive electrode Tx and the reference voltage line RVL corresponding to the other sensing electrode Rx. In addition, the mutual capacitance Cm can be formed between the sense line SENL corresponding to other drive electrode Tx and the data line DL corresponding to the sensing electrode Rx, and the mutual capacitance Cm can also be formed between the sense line SENL corresponding to the drive electrode Tx and the reference voltage line RVL corresponding to the other sensing electrode Rx.

In the above, embodiments of configuration of a drive electrode and a sensing electrode for a sub-pixel SP having a 3T1C structure are illustrated. However, if the sense line SENL and the reference voltage line RVL are not considered, and the scan line SCL is used only as the drive electrode, and the data line DL is used only as the sensing electrode, the same can be applied to the 2T1C structure as shown in FIG. 2.

Figure 13:
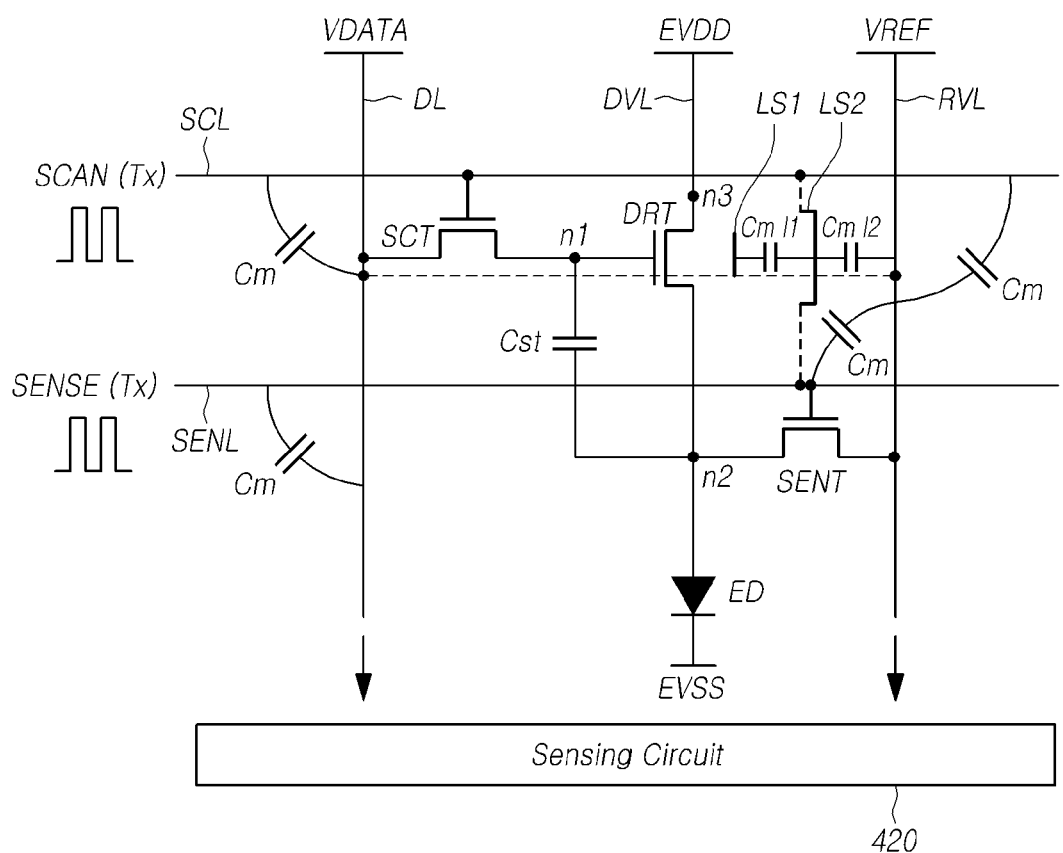
FIG. 13 is examples of an improved touch sensor structure for a sub-pixel having a 3T1C structure, when the touch display device according to embodiments of the present disclosure is an OLED display.

FIG. 13 is an example showing an improved touch sensor structure for a sub-pixel SP having a 3T1C structure, when the touch display device 100 according to the embodiments of the present disclosure is an OLED display.

As described above, the touch sensing method according to the embodiments of the present disclosure sequentially drives M gate lines (GL #1 to GL #12) as one drive electrode, simultaneously senses N data lines (DL #1 to DL #48) as one sensing electrode, and finds out the mutual capacitance between M gate lines (GL #1 to GL #12) and N data lines (DL #1 to DL #48) forming one touch node and its change to sense a touch and/or the touch coordinate.

Accordingly, if the mutual capacitance between the M gate lines (GL #1 to GL #12) and the N data lines (DL #1 to DL #48) can be increased, touch sensing accuracy can be improved. To this end, first and second light shield patterns LS1 and LS2 can be formed in or near the sub-pixel area.

The first light shield pattern LS1 is a pattern for expanding an area of a sensing electrode, and can be electrically connected to a display column line (data line and/or reference voltage line) serving as a sensing electrode.

The second light shield pattern LS2 is a pattern for expanding an area of a drive electrode, and can be electrically connected to a display row line (scan line and/or sense line) serving as a drive electrode.

The first and second light shield patterns (LS1 and LS2) are disposed around a layer having characteristic that can be changed by light, such as a channel (semiconductor layer) of the transistors (DRT, SCT, and SENT) and can serve to protect various layers by blocking light.

The display panel 110 can include a first light shield pattern LS1 electrically connected to the data line DL serving as a sensing electrode.

The display panel 110 can include a first light shield pattern LS1 electrically connected to the reference voltage line RVL serving as a sensing electrode.

The display panel 110 can include a first light shield pattern LS1 electrically connected to both the data line DL and the reference voltage line RVL that serve as a sensing electrode.

In other words, the display panel 110 can include a first light shield pattern LS1 electrically connected to one or more of the data line DL and the reference voltage line RVL corresponding to the display column lines.

The display panel 110 can include a second light shield pattern LS2 electrically connected to the scan line SCL serving as a drive electrode. The mutual capacitance Cm11 can also be formed between the first and second light shield patterns LS1 and LS2.

The display panel 110 can include a second light shield pattern LS2 electrically connected to the sense line SENL serving as a drive electrode. The mutual capacitance Cm11 can also be formed between the first and second light shield patterns LS1 and LS2. In addition, the mutual capacitance Cm12 can be formed between the second light shield pattern LS2 and the reference voltage line RVL.

The display panel 110 can include a second light shield pattern LS2 that is electrically connected to both the scan line SCL and the sense line SENL which serve as a drive electrode. The mutual capacitance Cm11 can also be formed between the first and second light shield patterns LS1 and LS2. In addition, the mutual capacitance Cm12 can be formed between the second light shield pattern LS2 and the reference voltage line RVL.

The display panel 110 can include a second light shield pattern LS2 electrically connected to at least one of the scan line SCL and the sense line SENL corresponding to the display row lines.

Figure 14:
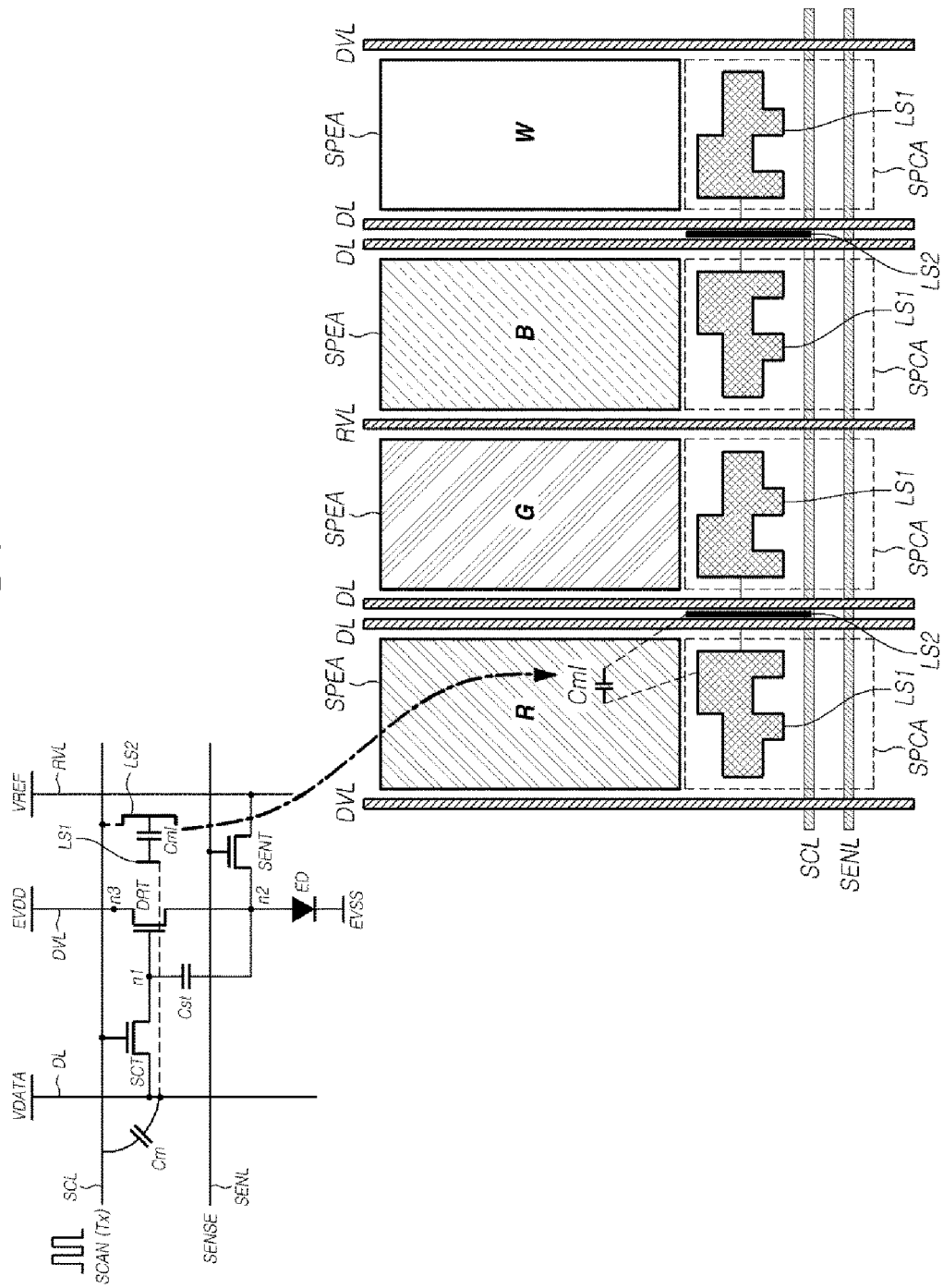
FIG. 14 is a plan view illustrating a formation position of light shield patterns for an improved touch sensor structure for a sub-pixel having a 3T1C structure, when the touch display device according to embodiments of the present disclosure is an OLED display.

FIG. 14 is a plan view illustrating a formation position of light shield patterns for an improved touch sensor structure for a sub-pixel having a 3T1C structure, when the touch display device 100 according to embodiments of the present disclosure is an organic light emitting diode (OLED) display.

FIG. 14 is a plan view showing an area in which four sub-pixels R, G, B, and W are disposed, in order to explain the formation position of the first and second light shield patterns LS1 and LS2. However, it is assumed that FIG. 14 has the same sub-pixel structure as FIG. 13.

Referring to FIG. 14, each of the four sub-pixels R, G, B, and W can include a light emitting area SPEA that emits light as an area where the anode electrode and the cathode electrode overlap with a light emitting layer interposed therebetween, and a circuit area SPCA in which transistors (DRT, SCT, SENT), capacitor Cst, and the like to supply driving current to the anode electrode are formed.

Referring to FIG. 14, the scan line SCL and the sense line SENL corresponding to a display row line can be disposed while passing through the circuit area SPCA. The data line DL, the driving voltage line DVL, and the reference voltage line RVL corresponding to the display column line can be disposed between adjacent sub-pixels or while passing through a boundary.

Referring to FIG. 14, the first light shield pattern LS1 can be disposed in the circuit area SPCA of each of four sub-pixels R, G, B, and W. For example, the first light shield pattern LS1 can be disposed to overlap the channel of each driving transistor DRT of the plurality of sub-pixels SP.

As described above, the first light shield pattern LS1 can be electrically connected to one or more display column lines of the data line DL and the reference voltage line RVL.

The second light shield pattern LS2 can be disposed between display column lines intersecting the scan line SCL and the sense line SENL.

For example, as shown in FIG. 14, the second light shield pattern LS2 can be disposed between the data lines DL intersecting the scan line SCL and the sense line SENL.

Referring to FIG. 14, the first light shield pattern LS1 and the second light shield pattern LS2 can be spaced apart from each other.

Referring to FIG. 14, the mutual capacitance Cm1 can be formed between the first light shield pattern LS1 connected to a display column line (e.g., a data line) serving as a sensing electrode, and the second light shield pattern LS2 connected to a display row line (e.g., a scan line SCL) serving as a drive electrode.

Accordingly, the mutual capacitance formed between the display column line (e.g., data line) serving as a sensing electrode and the display row line (e.g., scan line SCL) serving as the drive electrode can be greatly increased.

The touch sensing method according to the embodiments of the present disclosure described above can also be applied to the case where the touch display device 100 is a liquid crystal display (LCD).

Figure 15:
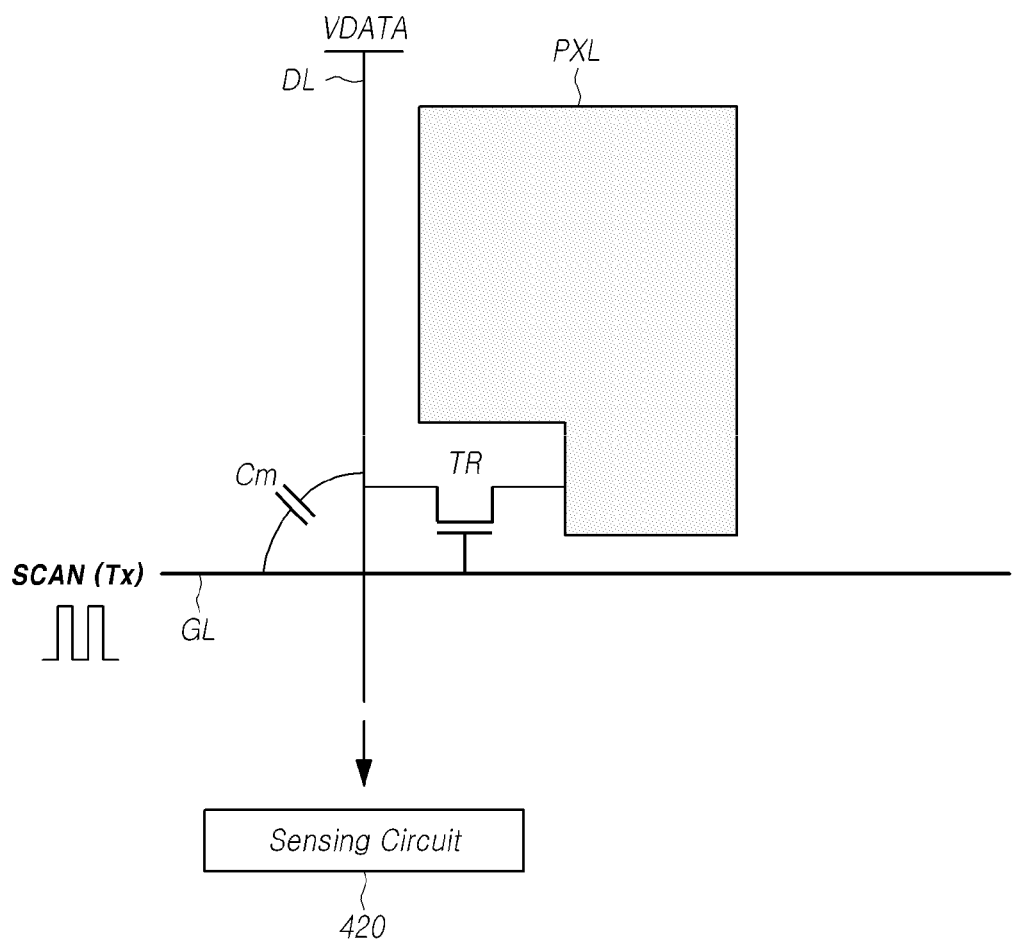
FIG. 15 is an example showing a touch sensor structure for a sub-pixel, when the touch display device according to embodiments of the present disclosure is an LCD.

FIG. 15 is an example showing a touch sensor structure for a sub-pixel, when the touch display device 100 according to embodiments of the present disclosure is a liquid crystal display (LCD).

Referring to FIG. 15, each sub-pixel SP in a liquid crystal display (LCD) includes a transistor TR and a pixel electrode PXL. The transistor TR can include a source node (or drain node) electrically connected to the data line DL, a gate node electrically connected to the gate line GL, and a drain node (or source node) electrically connected to the pixel electrode PXL.

Referring to FIG. 15, when the transistor TR is turned on, the image data voltage VDATA supplied to the data line DL can be applied to the pixel electrode PXL through the transistor TR. An electric field is formed between the pixel electrode PXL to which the image data voltage VDATA is applied and a common electrode (not shown) to which a common voltage is applied, and the transmittance of the liquid crystal layer is controlled by this electric field so that the brightness of the light at a corresponding sub-pixel SP can be varied.

Referring to FIG. 15, in the touch sensing method according to the embodiments of the present disclosure, the gate line GL of FIG. 15 is used as a drive electrode, the data line DL is used as a sensing electrode, and can be electrically connected to the sensing circuit 420.

Briefly describing the touch display device 100 according to the above-described embodiments of the present disclosure, the touch display device 100 can include a display panel 110 in which a plurality of display column lines and a plurality of display row lines are disposed to intersect each other, a display row driving circuit (e.g., a gate driving circuit) sequentially outputting display row driving signals to a plurality of display row lines, a display column driving circuit (e.g., a source driving circuit) for outputting display column driving signals to a plurality of display column lines, and a sensing circuit 420 for grouping and sensing a plurality of display column lines for every N (N is a natural number of 2 or more).

While the sensing circuit 420 senses N display column lines included in a first display column line group among a plurality of display column line groups in which a plurality of display column lines are grouped for every N, the display row driving circuit (e.g., the gate driving circuit) can output M display row signals sequentially having a pulse section PT including two or more pulses P1 and P2 to the M (M is a natural number of 2 or more) display row lines among a plurality of display row lines, during one frame time.

When the touch display device 100 is an OLED display, a plurality of display row lines include one or more of the scan line SCL and the sense line SENL, and a plurality of display column lines can include one or more of the data line DL and the reference voltage line RVL.

When the touch display device 100 is an LCD display, a plurality of display row lines can include a gate line GL, and a plurality of display column lines can include the data line DL.

Figure 16:
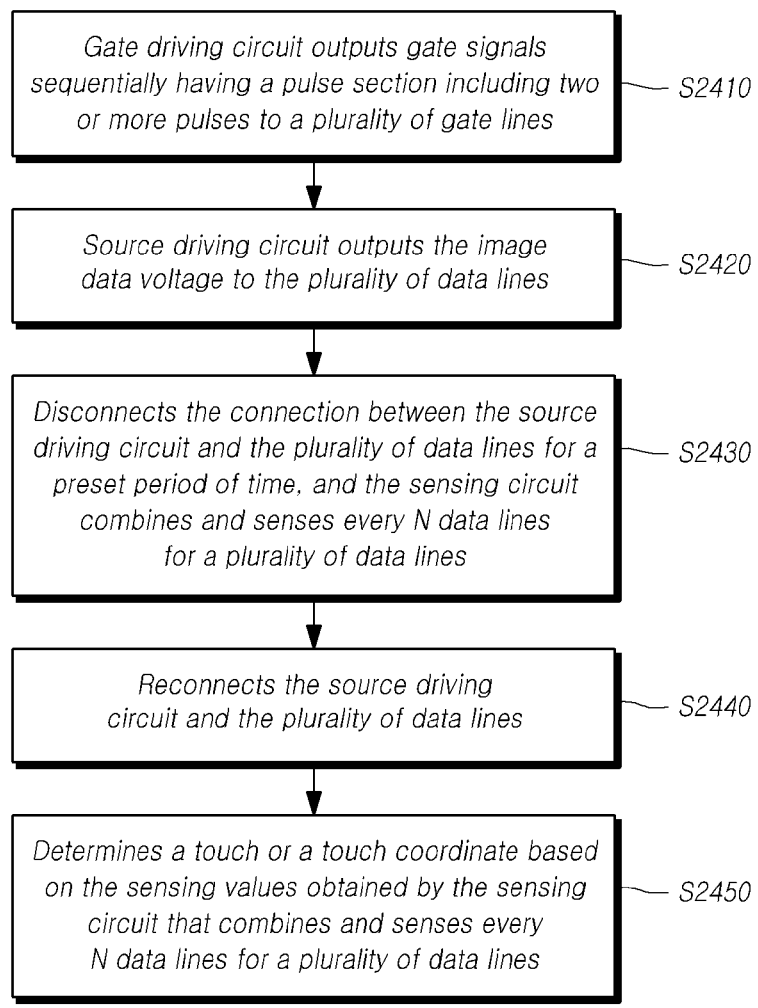
FIG. 16 is a flowchart of a touch sensing method of a touch display device according to embodiments of the present disclosure.

FIG. 16 is a flowchart of a touch sensing method of a touch display device 100 according to embodiments of the present disclosure.

Referring to FIG. 16, the touch sensing method of the touch display device 100 according to embodiments of the present disclosure can include a step S2410 of outputting gate signals GATE sequentially having a pulse section PT including two or more pulses P1 and P2 to a plurality of gate lines GL by the gate driving circuit 130, a step S2420 of outputting the image data voltage VDATA to a plurality of data lines DL by a source driving circuit 410, a step S2430 of disconnecting the connection between the source driving circuit 410 and the plurality of data lines DL for a preset period of time, and combining and sensing every N data lines for the plurality of data lines DL by a sensing circuit 420, and a step S2450 of determining a touch or a touch coordinate based on the sensing values obtained by sensing by the sensing circuit 420.

The touch sensing method of the touch display device 100 according to embodiments of the present disclosure can further include a step (S2440) after the preset period of time, of reconnecting the source driving circuit 410 and the plurality of data lines DL.

Meanwhile, The touch sensing method of the touch display device 100 according to embodiments of the present disclosure can include a first step of outputting gate signals GATE sequentially having a pulse section PT including two or more pulses P1 and P2 to a plurality of gate lines GL by a gate driving circuit 130, a second step of outputting the image data voltage VDATA to a plurality of data lines DL by a source driving circuit 410, a third step of combining and sensing every N data lines for the plurality of data lines DL or combining and sensing every N reference voltage lines for a plurality of reference voltage lines RVL by a sensing circuit 420, and a fourth step of determining a touch or a touch coordinate based on the sensing values obtained by sensing by the sensing circuit 420.

According to the embodiments of the present disclosure described above, a touch can be sensed without a separate touch sensor structure for touch sensing. Thus, the size of the touch display device 100 can be greatly reduced, and the number of components and manufacturing process can be simplified.

In addition, according to embodiments of the present disclosure, a display and a touch sensing can be simultaneously performed without having a separate touch sensor structure for touch sensing. Accordingly, it is possible to secure the display driving time and the touch sensing time as much as possible, thereby improving the display performance and the touch sensing performance.

In addition, according to embodiments of the present disclosure, the large touch display device 100 can be easily implemented.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device comprising:
a display panel in which a plurality of data lines and a plurality of gate lines are intersected with each other, and which includes a plurality of sub-pixels connected to the plurality of data lines and the plurality of gate lines;
a gate driving circuit configured to sequentially output gate signals to the plurality of gate lines; and
a data driving circuit configured to output image data voltages to the plurality of data lines,
wherein the data driving circuit includes a source driving circuit configured to output the image data voltages to the plurality of data lines, and a sensing circuit configured to group and sense every N data lines of the plurality of data lines, where N is a natural number of 2 or more,
wherein while the sensing circuit senses N data lines included in a first data line group among a plurality of data line groups having the plurality of data lines that are grouped for every N data lines,
wherein the gate driving circuit outputs M gate signals sequentially having a pulse section including two or more pulses to each of M gate lines among the plurality of gate lines during a display period of one frame, where M is a natural number of 2 or more, wherein an area occupied by M*N sub-pixels in which the N data lines and the M gate lines are connected is one touch node for touch sensing, and wherein the touch sensing is performed for the one touch node corresponding to the area occupied by M*N sub-pixels during a time period between adjacent pulses among the two or more pulses of the pulse section within the display period of the one frame.

2. The touch display device of claim 1, wherein the data driving circuit further comprises a plurality of sensing timing control switches that control an electrical connection between the plurality of data lines and the source driving circuit, and the plurality of sensing timing control switches have at least one turn-off state during the pulse section of each of the gate signals.

3. The touch display device of claim 2, wherein the sensing circuit comprises a plurality of analog front end circuits corresponding to the plurality of data line groups, wherein the plurality of analog front end circuits comprise a first analog front end circuit corresponding to the first data line group, wherein the first analog front end circuit comprises a sum circuit and a sum charge amplifier, wherein the sum circuit comprises N sampling capacitors, one end of each of the N sampling capacitors is electrically connected to a respective one of the N data lines included in the first data line group, and all other ends of each of the N sampling capacitors are electrically connected to each other, wherein the sum charge amplifier comprises:

an operational amplifier including a sensing input terminal to which all other ends of each of the N sampling capacitors are electrically connected, a reference input terminal to which a reference voltage is applied, and a sensing output terminal that outputs a sum output signal;

a feedback capacitor connected between the sensing output terminal and the sensing input terminal of the operational amplifier; and a sum reset switch connected between the sensing output terminal and the sensing input terminal of the operational amplifier, wherein the plurality of sensing timing control switches and the N data lines included in the first data line group are electrically connected in first points, wherein the one end of each of the N sampling capacitors is connected, between a respective one of the N data lines included in the first data line group and a respective one of the first points, and wherein during the one frame, the pulse section of each of the gate signals includes two or more turn-on level gate voltage sections and one or more turn-off level gate voltage sections.

4. The touch display device of claim 3, wherein the sensing timing control switches are in a turn-on state, during a turn-off level gate voltage section that is not the pulse section in the gate signals, and the sensing timing control switches are in the turn-off state, during a turn-off level gate voltage section in the pulse section in the gate signal.

5. The touch display device of claim 3, wherein the first analog front end circuit further comprises a dual sampling integrating circuit which is electrically connected to the sensing output terminal of the sum charge amplifier, receives a positive sum output signal and a negative sum output signal of the sum charge amplifier, inverts the negative sum output signal to sum with the positive sum output signal, and integrates the summed signal and outputs the integrated signal.

6. The touch display device of claim 5, wherein the dual sampling integrating circuit comprises a dual sampling switch circuit and an integrator, wherein the dual sampling switch circuit comprises a positive sampling switch circuit and a negative sampling switch circuit, and the positive sampling switch circuit and the negative sampling switch circuit are connected in parallel between the sensing output terminal of the sum charge amplifier and an integral input terminal of the integrator, wherein the positive sampling switch circuit comprises a positive sampling capacitor; a first positive switch connected between one end of the positive sampling capacitor and the sensing output terminal of the sum charge amplifier; a second positive switch connected between the other end of the positive sampling capacitor and the integral input terminal of the integrator; a third positive switch connected between the other terminal of the positive sampling capacitor and an integral reference voltage node; and a fourth positive switch connected between the one end of the positive sampling capacitor and the integral reference voltage node, and wherein the negative sampling switch circuit comprises a negative sampling capacitor; a first negative switch connected between one end of the negative sampling capacitor and the integral reference voltage node; a second negative switch connected between the one end of the negative sampling capacitor and the sensing output terminal of the sum charge amplifier; a third negative switch connected between the other end of the negative sampling capacitor and the integral reference voltage node; and a fourth negative switch connected between the other end of the negative sampling capacitor and the integral input terminal of the integrator.

7. The touch display device of claim 3, wherein during the turn-off level gate voltage section in the pulse section of the gate signal, the sum reset switch is changed from the turn-off state to the turn-on state, and then changed again to the turn-off state.

8. The touch display device of claim 3, wherein during a first period within the one frame, the gate driving circuit sequentially outputs gate signals sequentially having the pulse section to the M gate lines intersecting the N data lines included in the first data line group, the data driving circuit outputs the image data voltages to the N data lines included in the first data line group, and during the first period, the sum charge amplifier in the first analog front end circuit outputs the sum output signal corresponding to capacitances between the N data lines included in the first data line group and the M gate lines.

9. The touch display device of claim 1, wherein each of the plurality of sub-pixels comprises:

a light emitting device;

a driving transistor configured to drive the light emitting device;

a scan transistor which is controlled to be turned on/off by a scan signal that is one type of the gate signal supplied from a scan line that is one type of the gate line, and controls an electrical connection between a first node of the driving transistor and the data line; and a storage capacitor configured to be electrically connected between the first node and a second node of the driving transistor, wherein the data line electrically connected to the first node of the driving transistor through the scan transistor is electrically connected to the sensing circuit.

10. The touch display device of claim 9, wherein the display panel further comprises at least one of a first light shield pattern electrically connected to the data line and a second light shield pattern electrically connected to the scan line, and wherein the scan signal has a pulse section including two or more pulses within the one frame.

11. The touch display device of claim 9, wherein each of the plurality of sub-pixels further comprises a sense transistor which is controlled to be turned on/off by a sense signal that is another type of the gate signal supplied from a sense line that is another type of the gate line, and controls an electrical connection between the second node of the driving transistor and a reference voltage line, and at least one of the scan signal and the sense signal has a pulse section including two or more pulses within the one frame.

12. The touch display device of claim 11, wherein the display panel further comprises: at least one of a first light shield pattern electrically connected to at least one of the data line and the reference voltage line; and a second light shield pattern electrically connected to at least one of the scan line and the sense line, wherein the first light shield pattern is disposed to overlap a channel of the driving transistor of each of the plurality of sub-pixels, and wherein the second light shield pattern is disposed between display column lines intersecting the scan line and the sense line.

13. The touch display device of claim 11, wherein the reference voltage line is electrically connected to the sensing circuit.

14. The touch display device of claim 2, wherein a time section in which the sensing timing control switches are turned off corresponds to a touch sensing period in which the sensing circuit performs sensing, and a time section period in which the sensing timing control switches are turned on corresponds to a display driving period in which the source driving circuit outputs the image data voltages.

15. The touch display device of claim 1, wherein a separately generated turn-off level gate voltage section in the pulse section of the gate signal is used as the touch sensing period.

16. The touch display device of claim 2, wherein the plurality of sensing timing control switches are configured to disconnect a connection between the source driving circuit and the plurality of data lines for a preset period, and after the preset period, reconnect the source driving circuit and the plurality of data lines, while the source driving circuit outputs the image data voltages to the plurality of data lines.

17. A data driving circuit comprising: a source driving circuit configured to output image data voltages to a plurality of data lines; a sensing circuit configured to group and sense every N data lines of the plurality of data lines, where N is a natural number of 2 or more; and a plurality of sensing timing control switches configured to disconnect a connection between the source driving circuit and the plurality of data lines for a preset period and then to reconnect the source driving circuit and the plurality of data lines, while the source driving circuit outputs the image data voltages to the plurality of data lines, wherein during a period in which the connection between the source driving circuit and the plurality of data lines is disconnected by the plurality of sensing timing control switches, the sensing circuit senses N data lines included in a first data line group among a plurality of data line groups in which the plurality of data lines are grouped for every N data lines.

18. The data driving circuit of claim 17, wherein a time section in which the sensing timing control switches are turned off corresponds to a touch sensing period in which the sensing circuit performs sensing, and a time section in which the sensing timing control switches are turned on corresponds to a display driving period in which the source driving circuit outputs the image data voltages.

19. A touch display device comprising:

a display panel in which a plurality of display column lines and a plurality of display row lines are intersected with each other;

a display row driving circuit configured to sequentially output display row driving signals to the plurality of display row lines;

a display column driving circuit configured to output display column driving signals to the plurality of display column lines; and a sensing circuit configured to group and sense the plurality of display column lines for every N display column lines, where N is a natural number of 2 or more, wherein the sensing circuit is further configured to:

sense N display column lines included in a first display column line group among a plurality of display column line groups in which the plurality of display column lines are grouped for every N display column lines for touch sensing, while the display row driving circuit outputs M display row driving signals sequentially having a pulse section including two or more pulses to each of M display row lines among the plurality of display row lines, where M is a natural number of 2 or more, and wherein the touch sensing is performed during a time period between adjacent pulses among the two or more pulses of the pulse section within a display period of one frame.

20. The touch display device of claim 19, wherein display panel includes a plurality of sub-pixels connected to the plurality of display row lines and the plurality of display column lines, and each of the plurality of sub-pixels comprises:

a light emitting device;

a driving transistor configured to drive the light emitting device;

a scan transistor which is controlled to be turned on/off by a scan signal supplied from a scan line, and controls an electrical connection between a first node of the driving transistor and a data line;

a sense transistor which is controlled to be turned on/off by a sense signal supplied from a sense line, and controls an electrical connection between a second node of the driving transistor and a reference voltage line; and a storage capacitor configured to be electrically connected between the first node and the second node of the driving transistor, wherein the plurality of display row lines include at least one of the scan line and the sense line, and the plurality of display column lines include at least one of the data line and the reference voltage line.

21. A touch display device comprising: a display panel including a plurality of data lines, a plurality of gate lines, and a plurality of sub-pixels; a gate driving circuit configured to output gate signals to the plurality of gate lines; and a data driving circuit configured to output image data voltages to the plurality of data lines, wherein at least one of the gate signals includes a pulse section including a first pulse and a second pulse applied to a same gate line among the plurality of gate lines during one display frame, and wherein the data driving circuit is further configured to: perform touch sensing for a touch node corresponding to the same gate line in a sensing period between the first pulse and the second pulse while an image data voltage is applied to one sub-pixel among the plurality of sub-pixels corresponding to the same gate line during the one display frame.

22. The touch display device of claim 21, wherein the data driving circuit includes:
a source driving circuit configured to output the image data voltages to the plurality of data lines; and
a plurality of sensing timing control switches connected between the plurality of data lines and the source driving circuit, and
wherein the data driving circuit is further configured to:
in response to a falling edge of the first pulse, disconnect at least one data line among the plurality of data lines from the source driving circuit by opening one of the plurality of sensing timing control switches, and
in response to a rising edge of the second pulse, reconnect the at least one data line to the source driving circuit by closing the one of the plurality of sensing timing control switches.

23. The touch display device of claim 22, wherein the data driving circuit further includes:
a touch sensing circuit configured to output a touch coordinate based on a voltage sensed from the at least one data line in the sensing period between the first pulse and the second pulse.

* * * * *